(12) United States Patent
Niedzwiecki et al.

(10) Patent No.: US 7,254,511 B2
(45) Date of Patent: Aug. 7, 2007

(54) METHOD AND APPARATUS FOR CALIBRATING A FREQUENCY DOMAIN REFLECTOMETER

(75) Inventors: Joshua D. Niedzwiecki, Manchester, NH (US); Matthew A. Taylor, Weare, NH (US); Mark Lande, Nashua, NH (US)

(73) Assignee: BAE Systems Information And Electronic Systems Integration Inc., Nashua, NH (US)

( * ) Notice: Subject to any disclaimer, the term of this patent is extended or adjusted under 35 U.S.C. 154(b) by 231 days.

(21) Appl. No.: 11/110,264

(22) Filed: Apr. 20, 2005

(65) Prior Publication Data

US 2005/0234662 A1 Oct. 20, 2005

Related U.S. Application Data

(63) Continuation-in-part of application No. 11/034,676, filed on Jan. 13, 2005, now abandoned.

(60) Provisional application No. 60/536,886, filed on Jan. 15, 2004, provisional application No. 60/536,977, filed on Jan. 15, 2004.

(51) Int. Cl.
*G06F 19/00* (2006.01)
*G01R 35/00* (2006.01)
(52) U.S. Cl. ...................... 702/118; 324/601
(58) Field of Classification Search ............ 702/81–87, 702/118; 324/601
See application file for complete search history.

(56) References Cited

U.S. PATENT DOCUMENTS

| 4,630,228 A | * | 12/1986 | Tarczy-Hornoch et al. ... 702/59 |
| 5,068,614 A | | 11/1991 | Fields et al. |
| RE35,561 E | * | 7/1997 | Mashikian et al. ......... 324/520 |
| 5,949,236 A | | 9/1999 | Franchville |
| 5,994,905 A | | 11/1999 | Franchville |
| 6,417,674 B1 | | 7/2002 | Rowell et al. |

OTHER PUBLICATIONS

PCT International Search Report dated Mar. 29, 2006 of International Application No. PCT/US05/01799 filed Jan. 13, 2005, all pages.

* cited by examiner

*Primary Examiner*—Donald E. McElheny, Jr.
*Assistant Examiner*—Victor J. Taylor
(74) *Attorney, Agent, or Firm*—Robert K. Tendler; Daniel J. Long

(57) ABSTRACT

A calibration system is provided for calibrating frequency domain reflectometers in the field by using both the scattering parameters of the multi-port junction determined at the factory and changing the offset and gain terms used in generating a complex reflection coefficient by using internal calibrated loads so that heavy, cumbersome external calibrated transmission lines are not required. In one embodiment the internal calibrated loads include RLC circuits and in another embodiment the internal calibrated loads include attenuators. Further, retesting or recalibration does not necessitate reconnecting the cable under test, which may remain connected to the reflectometer's test port throughout the procedure.

23 Claims, 14 Drawing Sheets

6-Port Operation $$\left|\Gamma_\ell - g_3\right|^2 = \frac{|D|^2}{|A|^2} \cdot \frac{P_3}{P_4}$$

A = 6-Port network parameter
B = 6-Port network parameter
C = 0
D = 6-Port network parameter
$\Gamma_\ell$ = reflection coefficient
$g_3 = -B/A$

*Fig. 11*

$$\Gamma(f) = \sum_{m=1}^{M} S_{11,m}\, e^{(2d_m \alpha \sqrt{f} - j[4\pi d_m f])} \prod_{p=1}^{m-1} S_{12,p}\, S_{21,p}$$

$$\Rightarrow \underbrace{\left[ e^{-2d_m \alpha \sqrt{f}} \right]}_{\text{Attenuation}} \cdot \underbrace{e^{-j\frac{4\pi d_m f}{v}}}_{\text{Rotation}}$$

*Fig. 12*

METHOD AND APPARATUS FOR CALIBRATING A FREQUENCY DOMAIN REFLECTOMETER

RELATED APPLICATIONS

This application is a Continuation-In-Part of U.S. application Ser. No. 11/034,676, filed Jan. 13, 2005 now abandoned which claims benefit of U.S. Provisional Application No. 60/536,886 filed Jan. 15, 2004, and U.S. patent application Ser. No. 60/536,977 filed Jan. 15, 2004, the contents of which are incorporated herein by reference.

FIELD OF THE INVENTION

This invention relates to frequency domain reflectometers and more particularly to a down-conversionless system employing the use of a multi-port junction in combination with an Inverse Fourier Transform.

BACKGROUND OF THE INVENTION

It will be appreciated that faults in RF transmission lines and waveguides require detection so that the distance to the fault may be calculated. Moreover, the ability to detect and locate multiple faults that oftentimes result in ghosts that resemble faults requires sophisticated techniques to eliminate the need for skilled technicians.

Nowhere are reflectometers more desirable than in aircraft applications in which long lengths of cable or waveguides are used, both for the control of the aircraft and for the electronics devices such as radar or communication systems carried by the aircraft. Additionally, civilian use of reflectometers finds application in cable systems in which faults are detected based on the distance from a cable plant.

Likewise, for satellite and terrestrial-based communications, RF transmissions lines and waveguides can become faulty, especially at the interface between two cables as at a connection, and the ability to identify and locate the fault is a paramount concern.

A fault is anything that causes a change of impedance in the material properties of the cable or waveguide that causes some of the energy that is being transmitted through the transmission line to be reflected. Typically the faults occur at the interface between two cables, for instance, if a connection is not torqued properly or the connectors are old. If there is no good interface there will be a difference in material properties at the interface so that when one is sending a signal down the transmission line, at the interface some of the energy will be reflected. Thus, cable discontinuities or faults can be the result of interface problems between the cables or when a cable is bent and tweaked enough, the material properties will change at the bend that cause a reflection. Also, if the shielding to the cable is damaged in any way, part of the cable may couple to, for instance, the body of an aircraft, causing an impedance mismatch.

Thus, in the past, whether it be for military applications so that one does not have to tear into a large amount of cabling in an aircraft in order to locate a fault, or whether one is testing cell tower base stations to locate faults in transmission lines for the cell towers, or if one is using a distance-to-fault (DTF) detector for satellite ground terminals, there is a need to be able to automatically and accurately identify the fault, to find its severity and to obtain the distance to the fault, especially in a multi-fault environment.

There are two primary methods of determining faults in any transmission line. The first is based on time domain reflectometry and the other is based on frequency domain reflectometry. In time domain reflectometry one can simply place a pulse on a transmission line and measure the time it takes for a return pulse to be received. Propagation time within the cables therefore determines the distance of the fault to a measuring plane. Thus, by knowing the velocity of propagation of the specific cable, one can convert the time that the reflected pulse comes back to a distance to know how far away the fault is.

It is noted that time domain reflectometry is particularly well adapted for low frequency applications because one can easily create a system that produces short duration pulses that are narrow enough to resolve fault locations with acceptable accuracy. However, when one starts to get into high frequency applications exceeding for example 1 GHz, obtaining a physical system to produce an impulse that is of short enough duration is very difficult to realize in hardware. Moreover, even if one can create such a short pulse, the shape of the pulse is hard to control.

It is noted that those employing time domain reflectometry do not obtain information on spectral characteristics. With frequency domain reflectometry one has full control of the spectral characteristics. Thus, the other technique for reflectometry, which has proved to be quite useful, involves frequency domain reflectometry in which a couple of very different approaches have been used.

As illustrated in U.S. Pat. No. 4,630,228, what is described is a frequency difference method in which a swept source is applied to a device under test (DUT) and the reflected wave is mixed down and measured. Then the distance to the fault is determined by the difference frequency.

Another approach is illustrated in U.S. Pat. No. 5,068,614, which is the automation of a manual distance to fault or DTF technique that uses a spectrum analyzer and an offset tracking generator to find the distance to a fault. The output of the tracking generator is mixed with the return from the device under test. The tracking generator offset frequency is then adjusted to maximize the power displayed on the spectrum analyzer, with the distance to the fault calculated from the offset frequency. Note that this system also employs a frequency difference method.

As illustrated in U.S. Pat. Nos. 5,949,236 and 5,994,905, the systems employed are not frequency difference systems. Rather they measure the reflection coefficient of the device under test as a function of frequency. The reflection coefficient varies as a function of frequency. This variation is based on the location of each fault and the percent of energy reflected from each fault. If a device under test contains a single fault the reflection coefficient will vary as an exponentially decaying sinusoid across frequency. The method employed is to use an Inverse Fourier Transform or IFT to obtain an impulse or time domain response that is then used to determine the distance to the fault.

The problem with the methods described in these two patents is that they only measure the amplitude of the reflection coefficient, not the phase. This introduces non-linearities that generate harmonics and intermodulation products in the impulse response. These undesirable responses do not occur if there is only one fault. However, the number of spurious responses increases exponentially with multiple faults. These spurious responses are sometimes called ghosts.

In short, there are an extremely large number of spurious responses when a device under test contains several faults and removing them all becomes both cumbersome and, in some cases, impossible, at least by visual inspection of the results of an Inverse Fourier Transform (IFT).

To make matters somewhat worse, when one seeks to measure distance to fault over a wide operating frequency range, typically in the past the measured signals are down-converted to a single frequency range from which Inverse Fourier Transform measurements are obtained. Down-conversion adds its own set of problems and involves many local oscillators and mixers.

Additionally, when multiple faults are involved, the energy transmitted through the first fault will be of considerably lower amplitude when it reaches a subsequent fault. Thus, the apparent reflection from a subsequent fault, which may be more highly reflective than the first, oftentimes has a magnitude much less than the amplitude of the peak associated with the first fault due to the attenuation of the signal that gets by the first fault, and also due to line attenuation. The result is that one may fail to recognize a subsequent stronger fault. Thus, those systems that do not adjust for prior faults are incapable of distinguishing, in subsequent faults, the severity of the fault.

The result is that it takes an extremely skilled technician to be able to recognize that a certain peak is the result of a fault, especially when the peaks start to fall into the noise level due to the amplitude attenuation associated with the line itself. Secondly, those systems that use an inverse amplitude attenuation function to compensate for attenuation tend to mask the faults at greater and greater distances.

There are some frequency domain reflectometers that rely on phase shifts to determine the distance to a fault. However, those systems that measure phase shift only which are based on real phase shifts, have no attenuation information. While they do take into account phase shifts per unit length of transmission line, they fail to take into account attenuation per unit length of transmission line.

Finally, those systems that use an Inverse Fourier Transform without further processing are incapable of subtracting out the effect of previous faults when trying to identify or locate peaks useful in determining distance to a fault; or in determining the severity of a fault.

By way of further background, in order for some of the prior systems to be able to obtain a wide operational frequency bandwidth, some prior systems use a stepped frequency approach and down-conversion, in which one transmits a sine wave at a set number of frequency points within the defined bandwidth. At each frequency point one is radiating a sine wave and one seeks to be able to measure the amplitude and phase of the returned sine wave. In so doing, one obtains a discrete frequency response of the cable or waveguide. If one then performs an Inverse Fourier transform one obtains a temporal response, at which point one can obtain the same results as time domain reflectometers.

The trouble is that for a wide bandwidth, the prior art systems use down-convert, down-mix or heterodyning circuits, employing a local oscillator to down-mix to a signal that one can sample. One then needs to sample at one frequency range and then step through the remainder of the frequency ranges to obtain the wide bandwidth. For a wide bandwidth system it would be desirable to eliminate oscillators and down-converters and to eliminate a great many stepping functions.

More particularly, when one utilizes down-conversion, one wants to measure a vector voltage. In other words, one wants to measure the phase and amplitude. This is a relatively easy task at a single frequency, but the problem is, as soon as one starts trying to do it over a wide range of frequencies, devices become non-ideal and they are hard to calibrate. Thus, measuring a device over a wide frequency range is very difficult. In order to be able to do so, one down-converts to a single frequency and makes the measurements at this frequency.

Ghosts

As mentioned above, in multi-fault scenarios, prior frequency domain reflectometers suffer from ambiguities or ghosts, with ghost faults appearing at distances that are multiples of the actual distance between each fault. Ghosts can also appear if the reflectometer measures only the magnitude of the reflection coefficient. In the first case if one has a cable with multiple faults, one is going to get some energy reflected at the first fault, which is passed back to the receiver. Some energy propagates through the first fault and then is reflected from the second fault, with that energy passing all the way back to the receiver through the first fault. It is noted that there are also an infinite number of bounces between the two faults and each time some of the energy leaks back to the receiver. What one sees, therefore, are these delayed versions of the fault so that when one looks at the display one sees all of the ghost faults. In the second case, if one has a cable with multiple faults one will see faults at the sum and difference distances of those true fault locations. This occurs because the magnitude of the reflection coefficient does not contain enough information to resolve the actual locations therefore ghosts appear.

In the past, the processing philosophy was to first address the biggest fault, which was assumed to be the closest fault, and the fix it. Thereafter, one would test the cable or waveguide for the rest of the faults.

In short, both types of ghosts exist primarily by not measuring the amplitude and phase of the complex reflection coefficient at each frequency and or by not compensating for multiple reflections when determining fault locations. This results in false alarms that do not reflect where the fault is or even whether or not there is a fault.

There is therefore a requirement to provide a system that can measure the amplitude and phase of the reflection coefficient at each frequency for the transmission line under test and can identify the main peak for the first fault, the main peak for the second fault, et cetera. One could then see, identify and ignore reduced peaks at the sum and difference frequencies from which the actual peaks can be distinguished.

What is therefore required is a wideband frequency domain reflectometer that has easily configurable frequency coverage, that has automatic fault location for multiple faults, that discriminates against ghosts, that has accurate Fault Return Loss estimation and employs a quick initial calibration process. The reflectometer should also have the ability to test multiple different interconnected cables.

SUMMARY OF INVENTION

Rather than having to design hardware that is complicated with oscillators, mixers down-converters and even fairly high-speed analog-to-digital converters, in the subject system one uses a down-conversionless frequency domain reflectometer involving a multi-port junction, power detectors and a digital signal processor that employs an Inverse Fourier Transform.

The subject system improves on the operation of prior frequency domain reflectometers by utilizing a complex value of the reflection coefficient rather than its absolute magnitude to be able to detect and remove one source of ghosts and uses a means for estimating multiple faults to remove the second source of ghosts as described hereinabove.

Moreover, a modified Inverse Fourier Transform is used that takes into account not only the phase shift per unit length of transmission line but also the attenuation per unit length of transmission line to accurately measure the magnitude of each fault in a multi-fault environment.

In a further embodiment, in order to reduce computational complexity, a simple Inverse Fast Fourier Transform is performed first, followed by a process that refines fault locations derived from the Inverse Fast Fourier Transform. The refinement process utilizes the modified Inverse Fourier Transform, which operates on many fewer data points than those associated with the Inverse Fast Fourier Transform. Moreover, the refinement process compensates for granularity by calculating the modified Inverse Fourier Transform distances for not only a candidate fault distance but also for a set of distances to either side of each detected peak.

Additionally, the system compensates for the effect of prior faults and filters out faults below a predetermined threshold to filter out noise, secondary reflections and small, insignificant faults.

Moreover, in order to make using a multi-port junction easy, the reflectometer utilizes internal calibration which uses factory measured scattering parameters and a number of internal calibration loads. Since the characteristics of the passive multi-port junction do not vary after manufacture, the transfer function of the multi-port junction is measured at the factory. Thereafter, in a second step, the subject system uses one of two calibration procedures to characterize both the variability in the RF source output power and the variability in the detection circuitry characteristics across frequency whose response can drift after factory calibration. The first calibration procedure involves using a number of calibration loads internal to the reflectometer in conjunction with signal processing for computing gain and offset for each frequency and each port, while the other calibration procedure involves a matched load and a bank of switchable attenuators in conjunction with an alternative signal processing system for computing gain and offset for each frequency and each port. Regardless of which calibration procedure is used, new offsets and gains are generated to be substituted for the gains and offsets in the process that estimates the complex reflection coefficient used in the reflectometer.

As a result of the above techniques, an accurate estimate of the complex reflection coefficient frequency profile can be measured. Also, because the Inverse Fourier Transform operates on a complex value of the reflection coefficient after calibration, ghosts due to the multiple faults, non-linearities are eliminated. This is unlike prior Inverse Fourier Transform systems, which operate on the absolute magnitude of the reflection coefficient that does not take into account that the reflection coefficient is complex. Since it is, one can take advantage of this fact to correctly model the transmission line and therefore eliminate one source of ghosts.

Secondly, because the modified Inverse Fourier Transform takes into account line attenuation, the modified Inverse Fourier Transform accurately calculates the amplitudes of the reflection coefficients, thus to permit reliable detection and location of faults in a multi-fault environment. Calculation of the associated return losses or percent reflection is also made possible through the use of the modified Inverse Fourier Transform. Moreover, in one embodiment computational complexity is greatly reduced by first doing a simple and fast Inverse Fast Fourier Transform and then processing only a subset of the data points operated on by the first transform with the modified Inverse Fourier Transform.

As noted above, the multi-port junction eliminates the necessity for down-conversion and results in an ultrawide bandwidth reflectometer.

Finally, a calibration technique makes it convenient to use the multi-port junction in the field, with the calibration involving generating revised offset and gain parameters across frequency that account for the variability in the RF source power and variability in the detector circuitry. These estimated gains and offsets are then used in conjunction with detection circuitry output power measurements for estimating the complex reflection coefficient of the transmission line under test. This complex reflection coefficient frequency profile is then used by the rest of the signal processing chain to estimate the location and return loss of each fault in the transmission line.

It will be appreciated that because all of the calibration loads are internal to the reflectometer, the cable under test need not be disconnected, when it may be necessary to do more measurements or when it may be required to recalibrate the reflectometer. Note that it may be necessary to re-measure the cable under test after repairs and it is a feature of the subject invention, unlike prior art reflectometers that require external calibration loads, that the cable under test may remain coupled to the test port of the reflectometer for any further testing or calibration.

As a result, a field calibratable frequency domain reflectometer in one embodiment has a wide operating frequency from 10 MHz to 18 GHz that is the result of a down-conversionless system having a high dynamic range, greater than 70 dB. This means that faults can be detected at longer ranges, with the ability to detect, classify and locate multiple faults in a single transmission line. The use of the six-port junction in combination with a modified Inverse Fourier Transform is capable of handling a single series of connected transmission lines with multiple different propagation characteristics. Moreover, the system uses both phase and attenuation, thus eliminating the necessity for compensating for transmission line attenuation with an inverse attenuation characteristic that is ineffective. Thus, in the modified Inverse Fourier Transform, attenuation per unit length is part of the equation such that the use of phase shift alone is avoided.

In summary, a calibration system is provided for calibrating frequency domain reflectometers in the field by using both the scattering parameters of the multi-port junction determined at the factory and changing the offset and gain terms used in generating a complex reflection coefficient by using internal calibrated loads so that heavy, cumbersome external calibrated transmission lines are not required. In one embodiment the internal calibrated loads include RLC circuits and in another embodiment the internal calibrated loads include attenuators. Further, retesting or recalibration does not necessitate reconnecting the cable under test, which may remain connected to the reflectometer's test port throughout the procedure.

BRIEF DESCRIPTION OF THE DRAWINGS

These and other features of the subject invention will be better understood in connection with a Detailed Description, in conjunction with the Drawings, of which:

FIG. 11 is an algebraic expression relating to the operation of a six-port junction, defining six-port network parameters and the associated reflection coefficients;

FIG. 12 is an algebraic expression illustrating that in a reflection coefficient equation certain components thereof are related to attenuation per unit length of transmission line, with other components relating to rotation;

DETAILED DESCRIPTION

Figure 1:
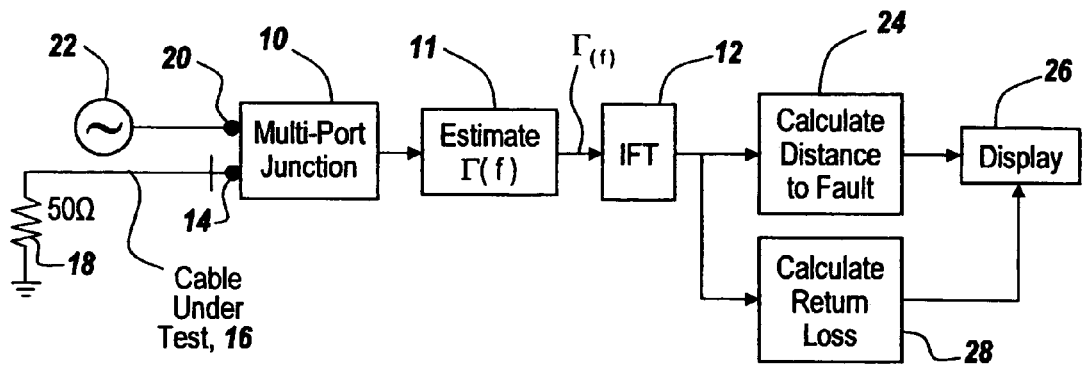
FIG. 1 is a block diagram illustrating a frequency domain reflectometer utilizing a multi-port junction in combination with an Inverse Fourier Transform to calculate distance to a fault, to calculate the return loss of the fault and to display the results.

Prior to describing the subject system in detail, a theoretical discussion of the subject system is presented.

It is a feature of the subject invention that since the output measurements from the six-port junction involves scaled versions of an RF source plus the returned signal from the cable under test, one can use these measurements to generate a complex reflection coefficient $\Gamma(f)$ of the entire transmission line, be it a cable or waveguide. This complex reflection coefficient is then used to derive the scattering parameters of the individual faults themselves. Once one has derived the scattering parameters, the distance and severity of a fault can be ascertained.

As the frequency is stepped or swept, the complex reflection coefficient of the cable is modified by the fault. If it is a perfect cable, then the cable has an impedance that is matched to the measuring circuit. Therefore, all of the energy propagates through the cable to ground and nothing gets reflected. In this case the $\Gamma(f)$ would be 0 across the entire test frequency range for a perfect cable.

However, if one has a fault, at every frequency that fault imparts an attenuation and phase shift to the signal. If one mathematically models the physics of the cable, one can derive what the amplitude and the phase profile looks like. Thus, in an imperfect cable, one will have a non-zero complex $\Gamma$ at every frequency. The $\Gamma$ is complex in that it is the result of an amplitude and phase shift of the outgoing signal. Using a number of power measurements from the multi-port junction, one is able to derive or estimate $\Gamma(f)$ for each frequency in the test range.

From microwave circuit theory, the complete transfer function between each combination of ports of a multi-port junction can be defined by the circuit's complex scattering parameters (S-parameters), also referred to as a scattering matrix (S-matrix), across the circuits entire operating frequency. In general, there is a complex scattering parameter denoted $S_{nm}(f)$ for each frequency "f" and each combination of ports "nm". Each scattering parameter describes the attenuation and phase shift imparted on a sinusoid of frequency "f" that is sent into port "m" and out of port "n". In the subject invention one is concerned with two junctions. One is the transmission line under test, which is a single port junction, and the other is the multi-port junction that is used to measure the transfer function of the transmission line under test. Because the transmission line is actually a single port junction it can be completely describe by its $S_{11}(f)$ parameter. This is known as the complex reflection coefficient of the transmission line across frequency and is denoted as $\Gamma(f)$. In the subject invention one uses the multi-port junction in conjunction with an RF signal source, power detector and a digital signal processor to measure the reflection coefficient of the transmission line. Therefore, one must know the entire N×N scattering matrix defined across the entire operating frequency of the multi-port junction to correctly measure $\Gamma(f)$ of the transmission line, where N is the number of ports in the multi-port junction. As described in the calibration section hereinafter, the scattering parameters of the multi-port junction are measured in the factory using a network analyzer and are stored in the digital signal processor memory to be used when calculating the reflection coefficient profile $\Gamma(f)$ for a device under test.

More particularly, in order to characterize a coupler, passive device, splitter or some other piece of hardware, one can characterize the device using what are called scattering parameters. Thus, the transfer function of the device is characterized by the scattering parameters. In general, scattering parameters are denoted by the letter S so that $S_{11}$ is the transfer function from when one sends a wave into port 1 and obtains a wave reflected from the same port. In general, $S_{11}$ will be the reflected wave divided by the incident wave and it is a complex number, meaning that it has both phase and amplitude. Determining the scattering parameters determines the transfer function of the fault, with the scattering parameters defining what happened at the fault. It has been found that, in a six-port junction in which one measures power at four different ports, one can use the four measured powers to solve equations that will yield the complex reflection coefficient frequency profile of the transmission line. Using this complex reflection coefficient frequency profile one can detect faults and determine their location and severity.

Multi-port junctions in general and the six-port junction specifically are described in an IEEE Transaction on Microwave Theory and Techniques, Vol. 45, No. 12, December 1997, in an article entitled "A Historical" Review of the Six-Port Measurement Technique" by Glenn F. Engen. It is noted that multi-port junctions are not and have not priorly been used to determine distance to a fault.

In this paper Engen describes a quantity $\Gamma_1$ that is determined by $q_3$, $D_2/A_2$, and P3/P4. It is therefore desirable to measure P3 and P4 and one knows $q_3$. D and A are the result of calibration so that one can solve for the reflection coefficient $\Gamma$. From $\Gamma$ derived from the multi-port junction as a function of frequency, one performs in an Inverse Fourier Transform and uses the result to determine the distance to fault and the magnitude of the fault.

Heretofore, six-port junctions have not been used to determine distance to fault, primarily because the calibration techniques required were exceptionally cumbersome. They involved carting around as many as six or eight heavy calibration cables and to calibrate the device at each of the frequencies to be used. Thus, while the six-port junction could be used in a laboratory for measuring the transfer function of various devices, it was not suitable for use in characterizing transmission lines, cables or waveguides in a non-laboratory setting.

It is noted that the transfer functions are critically dependent upon the calibration procedures used. This means that the quantities D and A in the six-port equation described in Engen were not easy to ascertain. Nor was it easy to ascertain $q_3$, which is defined as –B/A. Note that A, B and D are six-port network parameters, with C being set to 0.

The Modified IFT

Incorporation of Attenuation

Having ascertained that one can actually do a legitimate distance to fault determination using a six-port junction because one can sufficiently calibrate it with a relative degree of ease using an internal calibration scheme, it is important that when one performs the Inverse Fourier Transform on the complex reflection coefficient frequency profile $\Gamma(f)$ one takes into account both phase shift per unit length of transmission line and attenuation per unit length of transmission line.

More specifically, it is important to be able to accurately locate peaks without errors related to the amplitudes of prior faults. As mentioned hereinabove, prior art techniques have sought to compensate for transmission line attenuation by an approach involving multiplying the output of the Inverse Fourier Transform with an inverse attenuation function. All this does is to mask the peaks because, as mentioned before, as the distance to the fault increases, the amplitude of the effect can be lost in the noise. Thus one cannot apply an inverse attenuation without amplifying the effects of the noise in the measurements.

The reason that the inverse attenuation function does not work is that, first of all, existing frequency domain reflectometers utilize an inappropriate transform, mainly a simple Inverse Fourier Transform. The simple Inverse Fourier Transform does take into account the phase shift per unit length of the transmission line, but does not take into account the attenuation per unit length of the transmission line. To make up for this lack, the prior art systems apply a gain that attempts to compensate for the transmission line attenuation. This is applied after the transform and does not correctly take out the line attenuation, as it is an approximation.

In the subject invention, in order to take into account the transmission line attenuation, one modifies the transform itself so that it takes attenuation into account in the body of the transform. The result is that one obtains a more accurate distance to fault determination and a more accurate fault reflection coefficient magnitude.

By using the modified Inverse Fourier Transform one can obtain the magnitude of the reflection of the fault commonly referred to as the return loss at the fault in the multi-fault environment that usually exists.

Note that the usual Inverse IFT has a term $e^{-j\theta}$, namely the phase shift, which is different for every frequency.

However, the power to which e is raised must be complex in order to not only take into account phase shift but also attenuation. Note that while phase shift is real, the addition of attenuation makes the reflection coefficient a complex number.

The practical effect is that knowledge of the attenuation of the cable is subsumed in the transform. This is shown in the following equations. Note that Equation 0.1 shows the mathematical node under test and refers to the reflection coefficient of the cable, referenced to the DTF tester test port:

$$\Gamma_k = \sum_{m=1}^{M} e^{-2\gamma_k d_m} S_{11,m} \prod_{p=1}^{m-1} S_{12,p} S_{21,p} \quad (0.1)$$

where $$\gamma_k \equiv \alpha \sqrt{f_k} + j \frac{2\pi f_k}{v}$$

Note that in Equation 0.1, $\alpha \sqrt{f_k}$ is the attenuation per unit length. Here both v (speed of light in transmission line) and α are normalized by the frequency.

In the above equation, M is the number of faults. $\Gamma_k$ is the measured quantity, so it is known. $\gamma_K$ is known, since it depends only on the type of cable and the frequency. m is the index of the current fault. p is the index of the prior faults. M, $d_m$, $S_{11,m}$, $S_{12,m}$, and $S_{21,m}$ are unknown. To solve for $d_m$ and $S_{11,m}$.

$$\text{Let } S_m = S_{11,m} \prod_{p=1}^{m-1} S_{12,p} S_{21,p} \quad (0.2)$$

One assumes that the faults are wide band (to simplify the equations). This means that their S parameters do not vary over the swept frequency range. Substituting in $$\Gamma_k = \sum_{m=1}^{M} e^{-2\gamma_k d_m} S_m \quad (0.3)$$

Next, one processes this Γ(f) data with something similar to an Inverse Fourier Transform. This is the subject modified IFT, herein called the "Taylor transform.". It differs from an IFT in that the exponent in the summation is complex, and therefore takes into account the loss of the cable, in addition to the phase shift. Note that $h_m$ is the complex reflection coefficient for the distance m.

$$h_m = \frac{1}{K} \sum_{k=1}^{K} \sum_{n=1}^{M} e^{-2\gamma_k (d_n - d_m)} S_n \quad (0.4)$$

$$h_m = \frac{1}{K} \sum_{k=1}^{K} \Gamma_k e^{2\gamma_k d_m} \quad (0.5)$$

Realize that if there is no fault at location $d_n$, then $S_n=0$, so that the only locations that have an impact on $h_m$ are locations $d_m$ where actual faults exist. Given $h(d_m)$, one solves for $S_m$ $$S_m \approx h_m \quad (0.6)$$

since the only term that doesn't approximately integrate out in the equation above is when $d_n = d_m$. One then needs to solve for $S_{11,m}$. Previously it was noted that:

$$S_m = S_{11,m} \prod_{p=1}^{m-1} S_{12,p} S_{21,p} \approx h_m \quad (0.7)$$

$$S_{11,m} \approx \frac{h_m}{\prod_{p=1}^{m-1} S_{12,p} S_{21,p}} \quad (0.8)$$

but one does not know $S_{12,p}$ and $S_{21,p}$. If one assumes a reciprocal junction, then $S_{12,p} = S_{21,p}$, and therefore $$S_{11,m} \approx \frac{h_m}{\prod_{p=1}^{m-1} (S_{12,p})^2} \quad (0.9)$$

Since one only cares about finding the magnitude of $S_{11,m}$, $$|S_{11,m}| \approx \frac{|h_m|}{\prod_{p=1}^{m-1} |S_{12,p}|^2} \quad (0.10)$$

Additional Processing to Eliminate the Effect of Prior Reflections—Two-Step Process More particularly, after the inverse transform has been applied to the complex reflection coefficient representing the power outputs of the six-port junction, one nonetheless needs to find a way to subtract out the effect of the previous faults so that the amplitude of those faults does not corrupt the measurement of the fault in question. This corruption is usually in the form of noise and inconsequential faults.

Note that if one just applies a simple inverse attenuation curve, one really is reading the fault return loss magnitude off of the graph, which is incorrect. The reading has an error that is related to the amplitude of the prior faults and one therefore needs a way to subtract out the effect of the prior faults.

Note that if one has a reflection ahead of a second reflection, the first reflection is going to take off a certain amount of amplitude because one is not going to have that much of a signal going past the first reflection to the second reflection.

In order to take out the effect of prior reflections, one has to do a two-step process in which one first ascertains the distances of the faults before knowing their amplitudes. In order to do so, one solves for the magnitudes by making an approximating assumption. The assumption is that the fault behaves as a two-port device and that the device is lossless. This means that the power going out is the same as the power going in. In most cases, this is close to reality. One then makes some assumptions about phase. First of all, the phase of the output of that fault with respect to the input is assumed to be zero. Making that assumption, one can solve for the transfer function of the first fault. Once one solves for the transfer function of the first fault, then one has enough knowns to be able to solve for the transfer functions of the subsequent faults.

Normally, what one receives is a mixture of the losses from the first fault, the second fault, the third fault, et cetera.

Thus, one receives a relatively complicated set of data. By following the two-step process, what one is doing is making enough measurements so that one can form simultaneous equations and solve for the unknowns.

The net result is that one can correctly report the amplitude of a fault, meaning the magnitude of the reflection coefficient of each fault, even if it is preceded by another fault. Thereafter one can use simple amplitude thresholding to filter out low amplitude noise and inconsequential faults.

The presentation below describes this process as can be seen from Equations 0.6-0.10.

If one looks at Equation 0.10, one sees that the magnitude of fault m is shown as $S_{11,m}$. $S_{11,m}$ is derived from the microwave scattering parameters, meaning that it is the transfer function out of Port 1 and back to Port 1 of the particular prior fault in question. One in essence injects the signal into Port 1 and measures the reflected signal back, with the result being a complex quantity. Thus the magnitude of that particular fault is approximately equal to a quotient, with the top portion of the quotient being the magnitude of $h_m$.

The bottom of the quotient is a product, and it is a product of all of the magnitudes of prior faults from p=1 to m−1. p is an index of the prior faults, namely the faults to prior to the fault m that one is monitoring. If one looks at the magnitude squared, inside the magnitude is $S_{12,p}$. What this is saying is that it is the product of the forward transfer functions $S_{12}$ of all the faults prior to fault m. This procedure removes the effect of prior faults from the measurement of the magnitude of fault m. As a result, what is transpiring in the two-step process is that one takes each of the faults, determines its magnitude and corrects the value of the reflection coefficient of the fault in question by taking into account the magnitudes of all prior faults.

Calibration

In the subject invention one can easily use the subject multi-port junction because of the use of a unique calibration technique that can be applied in the field. The calibration technique uses a two-stage calibration process. The first stage is a factory calibration, in which the transfer function of the multi-port junction is characterized. This yields the scattering matrix as a function of frequency for the multi-port junction. This matrix is stored in the memory of the digital signal processor and is used in the process for generating the complex reflection coefficient Γ(f). The multi-port junction contains microwave components whose transfer functions are not expected to vary much over time or temperature. Thus, a one-time characterization is sufficient.

The second stage is done in the field, immediately prior to taking measurements, and it characterizes both the detection portion of the circuit and the RF signal source whose output power varies slightly with frequency. The detection portion of the circuit contains semiconductor components whose transfer characteristics vary over time and temperature. The RF source output power varies slightly across frequency due to imperfections in the device and also may drift over time. These variations can be modeled as gain and offset terms that affect the output power measurement of each multi-port junction output port as measured by the detection circuitry.

Therefore, to accurately estimate the complex reflection coefficient Γ(f) of the transmission line under test, the transfer function of the multi-port junction and the gains and offsets due to the RF source and detector circuitry variability must be accounted for.

In general the field calibration method involves applying at least two different calibration loads to the multi-port circuit. These two loads produce two data points for each frequency from which the gain and offset parameters of each port can be calculated for each test frequency.

In operation, regarding the field calibration process, the RF source is swept across a frequency band and measurements are obtained from each detector output at each test frequency for each calibration load. Prior to this, the multi-port junction complex scattering parameters are measured at the factory and are used in conjunction with the calibration circuit transfer functions, the switch transfer functions and standard electric component models for the detector circuitry. This allows one to produce a model of the signals measured by the analog-to-digital converter at each output port of the detection circuit for each calibration load. Note that the signal model includes the unknown offsets and gains for each port and each frequency. What these offsets and gains are comprised of depends on the type of power detectors used in the detection circuitry.

If square law power detectors are employed the gain term for each port accounts for the variation in the RF source power across frequency and accounts for the gains in the detector circuitry that map the output power from each port of the multi-port RF circuit, from watts to bits. The offset term in this configuration does not vary with frequency; instead it is a constant across frequency for each port. The offset value for each port is a function of the offsets in the detector circuitry.

If log based power detectors are employed, the gain term for each port accounts only for the gains in the detector circuitry that map the output power from each port of the multi-port RF circuit, from dBm to bits. Therefore, in this configuration there is a unique gain that is constant across frequency for each port. The offset term in this configuration does vary across frequency per port. This is because when log detectors are employed the variation in the RF source and the offsets inherent in the detection circuitry per port vary the offset of each signal across frequency as measured at the A/D outputs.

In the next step the gains and offsets in the system model are varied until one minimizes the square error between the measured A/D output signals for each calibration load and the corresponding model of those measurements. The system gains and offsets which result in minimum square error between the measured signals and the model are then used in conjunction with the factory measured scattering parameters of the multi-port RF circuit in the process for generating the complex reflection coefficient Γ(f).

Note that the number of calibration loads is greater than one and equal to or greater than the number of unknown calibration parameters. Note further that the accuracy of the offset and gain is proportional to the number of loads. The more loads used, the more accurately the offsets and gains can be estimated.

More particularly, the first stage of calibration uses a commercially available microwave laboratory network analyzer to measure the scattering parameters of the multi-port device. The second stage uses one of two calibration methods, one involving the use of attenuators between the signal source and the multi-port junction in conjunction with a matched load; and the other involving two or more RLC calibration standards to characterize the transfer functions of the detection circuits and the variability in the RF source power across frequency.

In the RLC method, the calibration can be done automatically by switching in the RLC calibration standards in a fashion transparent to the operator. In contrast, published six-port calibration methods use 5 to 12 external heavy calibration cables.

More particularly, it is the ability to pre-calibrate and rapidly re-calibrate in the field, which leads to the attractiveness of using a multi-port junction either for reflectometry or for other purposes where the multi-port junction is employed.

However, there are two issues with respect to frequency domain reflectometers using a multi-port junction. The first is the frequency source itself, the output of which as a function of frequency may vary over time. The second is the change over time of the power measurement diodes or log amplifiers and other semiconductor devices in the detection circuitry.

It is noted that the complex scattering parameters of the multi-port junction as a function of frequency can be ascertained at the factory using a standard network analyzer.

In a real system the source power is not exactly constant with frequency. Thus its variation must be accounted for in the calibration. Since the calibration incorporates the nominal source power, the variation with frequency is accounted for in offsets or gains applied to the detection circuit output signals depending on whether log or square law power detectors are used as described above. The detection circuitry contains components whose gains and offsets vary with time and are also accounted for in offsets and gains applied to the detection circuit output signals.

In order to be able to characterize the detectors and RF source power variation in the field two calibration methods are presented. The first involves sequentially switching the cable under test port to two or more known loads that are each comprised of a different RLC network. Each load has a complex reflection coefficient profile $\Gamma_c(f)$ across frequency that is measured by a network analyzer in the factory. Note c denotes the calibration load index. The complex reflection coefficient profiles for each calibration load are stored in system memory and used during field calibration to determine the gains and offsets.

It is important to note that since the source varies only slowly with frequency, one need not measure every frequency. Instead, the calibration measurement can take a thinned set of data and can be interpolated to reduce calibration time.

It is also important to note that one can construct an RLC microwave circuit that does not vary much with temperature. However, this invention does include the ability to measure and store the complex reflection coefficient profiles for each calibration standard taken at multiple different temperatures. Then, when they are used during field calibration a temperature sensor in the device can measure the current temperature of the system and perform the field calibration using the complex reflection coefficient profiles $\Gamma_c(f)$ that were measured at the closest temperature.

Note for the RLC load method, the value of each RLC element can be any practical valuable that results in the complex reflection coefficient profile of each load to be dissimilar across frequency. In one embodiment one uses a bond ribbon and either a 0.5-Ohm resistor or a 150-Ohm resistor depending on the calibration load used. The resistor is coupled to a 0.2 nH pedestal inductor, in turn coupled to a 100 pF chip capacitor to ground. By so doing one switches in one of two different calibration loads at the test port, from which not only can the characteristics of each of the diode detectors be measured, but also the power variation of the signal source with frequency. Thus with two internal RLC calibration loads, the characteristics of which are determined at the factory, one can quickly calibrate the reflectometer in the field without the use of multiple calibrated lengths of transmission line.

For each RLC calibration load the RF source is swept across frequency and the outputs of the each port of the detection circuit is measured with an A/D converter for each test frequency. In so doing one obtains a measured signal out of each detector across frequency for each calibration load denoted $b_{cn}(f)$. For each calibration load a signal model for the A/D measured detector outputs is generated denoted $\hat{b}_{cn}(f, g_n, a_n)$. This model is based on the scattering parameters of each calibration load and the multi-port RF circuit as measured during the factory calibration process. It is also based on the nominal RF source power, standard component models for the detector circuitry and the gains and offsets due to RF source power and detector circuitry variation.

It is therefore the purpose of this calibration procedure to determine the gains and offsets for each port that minimize the square error between the measured signals $b_{cn}(f)$ for each calibration load $\Gamma_c(f)$ and their respective signal model $\hat{b}_{cn}(f, g_n, a_n)$. Because the signal model can take on one of two forms depending on whether square law or log detectors are used, the calibration solution also has two respective forms. If log detectors are used then the gain term for each port remains constant while the offset varies with frequency. On the other hand, if square law detectors are used, then the gain term for each port varies with frequency and the offset remains constant. The calibration process, which involves selecting the gains and offsets that minimize the square error between the signal models and the measurements, is described mathematically for each detector type below.

Square Law Detectors Solution:

$$\{g_n(f), a_n\} = \arg\min \sum_{c=1}^{C} \left\| b_{cn}(f) - \hat{b}_{cn}(f, g_n(f), a_n) \right\|^2 \qquad (0.11)$$

Log Detectors Solution:

$$\{g_n, a_n(f)\} = \arg\min \sum_{c=1}^{C} \left\| b_{cn}(f) - \hat{b}_{cn}(f, g_n, a_n(f)) \right\|^2 \qquad (0.12)$$

where the signal model when Square Law Detectors are used is defined as:

$$\hat{b}_{cn}(f, g_n(f), a_n) = g_n(f) \cdot (\alpha_n(f)|\Gamma_c(f)|^2 + \beta_n(f)Re\{\Gamma_c(f)\} + \gamma_n(f)Im\{\Gamma_c(f)\} + \delta_n(f)) + \alpha_n \qquad (0.13)$$

and the signal model when Log Detectors are used is defined as:

$$\hat{b}_{cn}(f, g_n, a_n(f)) = g_n \cdot LOG_{10}(\alpha_n(f)|\Gamma_c(f)|^2 + \beta_n(f)Re\{\Gamma_c(f)\} + \gamma_n(f)Im\{\Gamma_c(f)\} + \delta_n(f)) + \alpha_n(f) \qquad (0.14)$$

In both models $\alpha_n(f)$, $\beta_n(f)$, $\gamma_n(f)$ and $\delta_n(f)$ are known parameters that are functions of the complex scattering parameters $s_{nm}(f)$ of the multi-port circuit and are also functions of the nominal RF source power $P_s$. These relationships are defined in equations 0.15-0.18 below.

$$\alpha_n(f) = P_s \cdot |s_{21}(f)s_{n2}(f)|^2 \qquad (0.15)$$

$$\beta_n(f) = P_s \cdot 2[Re\{s_{21}(f)s_{n2}(f)\}Re\{s_{n1}(f)\} + Im\{s_{21}(f)s_{n2}(f)\}Im\{s_{n1}(f)\}] \qquad (0.16)$$

$$\gamma_n(f) = P_s \cdot 2[Re\{s_{21}(f)s_{n2}(f)\}Im\{s_{n1}(f)\} - Im\{s_{21}(f)s_{n2}(f)\}Re\{s_{n1}(f)\}] \qquad (0.17)$$

$$\delta_n(f) = P_s \cdot |s_{n1}(f)|^2 \quad (0.18)$$

Notice that after substitution of the variables of Equations 0.15-0.18 into equations 0.13 and 0.14 one can see that both signal models are functions of the complex scattering parameters $s_{nm}(f)$ of the multi-port circuit as measured during factory calibration, the nominal source power $P_s$, and the complex reflection coefficient profile for each calibration standard $\Gamma_c(f)$ as measured in the factory. Note that in these equations n denotes the detector output port index and c denotes the calibration standard index. C denotes the total number of calibration standards.

It is important to note the gains and offsets are different for each port. Therefore the optimization described in equation 0.11 and 0.12 is performed independently for each detector port n.

On a port by port basis, taking the measurements from each port and each calibration standard and subtracting the model, yields an error for every trial of gain and offset ($g_n(f), a_n$ or $g_n, a_n(f)$), which when squared and summed over each calibration standard c, yields the total square error for every trial of gains and offsets. One then uses the gains and offsets that result in the minimum square error.

System models shown in Equations 0.13 and 0.14 are both linear equations in terms of the unknown gains and offsets ($g_n(f), a_n$ or $g_n, a_n(f)$). Therefore one can employ linear least squares optimization techniques to determine the values for those gains and offsets that best minimize the square error between the measurements and the model. It is known that one way to solve this type of linear least squares problem is to stack each measurement taken for each calibration load into a vector and define the known portions of the signal model in a matrix. Then using that vector and matrix, one directly computes the unknown gains and offsets.

In the calibration method involving attenuators, a 50-ohm, or matched load is switched to the cable under test port of the device. This has the effect of reducing the reflection from that port to a negligible value (i.e. $\Gamma(f) \approx 0$). Now the A/D measurements at each detector circuitry output port is a function of the RF source, the scattering parameters of the multi-port RF circuit and the internals of the detection circuitry. As stated before, if log power detectors are used such as Dynamic Log Video Amplifiers, DLVAs, then the gain is a constant value and the offset changes with frequency for each detector output port. If square law power detectors are uses such as diode detectors, then the gain changes over frequency and the offset is constant. These gains and offsets can be determined by varying the RF source power and at each power setting, sweeping the RF source across frequency, taking detector circuit output measurements using the A/D, and comparing the A/D measurement to a signal model for those measurements that is a function of the unknown gains and offsets. One then selects the gains and offsets that best minimize the error between the measurements and the model.

This can be accomplished by switching several attenuators between the probe and the RF source and taking power measurements over the region of interest. In place of the switchable attenuators one could also directly vary the RF source output power.

By varying the power, the set of power measurements at the detectors gives a full characterization of the variability of the RF source, and the gain and offset as determined by the detectors and the conversion from an A/D converter reading to a real power value. Once these power measurements are taken, the gain and the offset values can be determined using a variety of estimation algorithms.

Similar to the calibration method using RLC loads, the objective of the calibration method using attenuators is to select the values for the gains and offsets for each port that minimize the square error between the detector output measurement and the signal model for those measurements. This optimization is defined in equations 0.11 and 0.12 above. The only difference is that the signal model is slightly different for this calibration technique. In this calibration method the signal model for both square law and log power detectors are defined as follows.

Signal Model Using Square Law Detectors:

$$\tilde{b}_{cn}(f, g_n(f), a_n) = g_n(f) \cdot (P_{in}[c]|s_{n1}(f)|^2) + a_n \quad (0.19)$$

Signal Model Using Log Detectors:

$$\tilde{b}_{cn}(f, g_n, a_n(f)) = g_n \cdot \text{LOG}_{10}(P_{in}[c]|s_{n1}(f)|^2) + a_n(f) \quad (0.20)$$

where $s_{n1}(f)$ is the measured scattering parameters of the multi-port RF circuit between port 1 and port n and $P_{in}[c]$ is the known power incident on port (1) of the multi-port RF circuit when attenuator "c" is connected between the RF signal source and port (1) of the multi-port RF circuit. Note that alternatively, $P_{in}[c]$ can be defined as the RF signal source output power when no attenuator is used. In this case this power would differ for each calibration standard "c" by directly changing the RF source output power instead of using a bank of attenuators.

Similar to the calibration approach using RLC loads, on a port by port basis, taking the measurements from each port and each calibration standard and subtracting the model, yields an error for every trial of gain and offset ($g_n(f), a_n$ or $g_n, a_n(f)$), which when squared and summed over each calibration standard c, yields the total square error for every trial of gains and offsets. One then uses the gains and offsets that result in the minimum square error.

System models shown in Equations 0.19 and 0.20 are both linear equations in terms of the unknown gains and offsets ($g_n(f), a_n$ or $g_n, a_n(f)$). Therefore one can employ linear least squares optimization techniques to determine the values for those gains and offsets that best minimize the square error between the measurements and the model. It is known that one way to solve this type of linear least squares problem is to stack each measurement taken for each calibration load into a vector and define the known portions of the signal model in a matrix. Then using that vector and matrix, one directly computes the unknown gains and offsets.

Alternatively one can employ a two step process for estimating the gains and offsets. When log power detectors are employed, one can estimate the gains first using the equation below.

$$g_n = [1 \quad 0] \cdot (\underline{R}_n^T \underline{R}_n)^{-1} \underline{R}_n^T \underline{b}_n \quad (0.21)$$

where $$\underline{R}_n = \begin{bmatrix} 1 \cdot \log_{10}(P_{in}[1]) & 1 \\ \vdots & \vdots \\ 1 \cdot \log_{10}(P_{in}[C]) & 1 \end{bmatrix} \quad (0.22)$$

$$\underline{b}_n = [b_{1n}(1) \quad \cdots \quad b_{1n}(F) \quad \cdots \quad b_{Cn}(1) \quad \cdots \quad b_{Cn}(F)]^T \quad (0.23)$$

In the above equations $b_{cn}(f)$ denotes the measured signal out of port n at frequency f for attenuation (calibration standard) c as measured by the A/D converter, F denotes the total number of frequency measurements, C denotes the total number of attenuation values (calibration standards) used and $\underline{1}$ denotes an F×1 vector of ones.

Once the gain for each port is calculated the offsets are determined as follows.

$$\begin{bmatrix} a_n(1) \\ \vdots \\ a_n(F) \end{bmatrix} = (\underline{\Phi}^T\underline{\Phi})^{-1}\underline{\Phi}^T \cdot [\underline{b}_n - g_n\underline{e}_n] \text{ where} \quad (0.24)$$

$$\underline{e}_n = \begin{matrix} [\text{LOG}_{10}(P_{in}[1]|s_{n1}(1)|^2) \cdots \text{LOG}_{10}(P_{in}[1]|s_{n1}(F)|^2) \cdots \\ \text{LOG}_{10}(P_{in}[C]|s_{n1}(1)|^2) \cdots \text{LOG}_{10}(P_{in}[C]|s_{n1}(F)|^2)]^T \end{matrix} \quad (0.25)$$

$$\underline{\Phi} = \begin{bmatrix} \underline{I} \\ \vdots \\ \underline{I} \end{bmatrix}. \quad (0.26)$$

Note that in equation 0.26, the matrix $\underline{\Phi}$ contains C stacked identity matrices, where each identity matrix $\underline{I}$ is of dimension F×F.

This two step process is slightly different when square law power detectors are employed. In this case one first estimates the offset for each port using the following equations.

$$a_n = [1 \quad 0] \cdot (\underline{Q}_n^T\underline{Q}_n)^{-1}\underline{Q}_n^T\underline{b}_n \text{ where} \quad (0.27)$$

$$\underline{Q}_n = \begin{bmatrix} \underline{1} \cdot P_{in}[1] & \underline{1} \\ \vdots & \vdots \\ \underline{1} \cdot P_{in}[C] & \underline{1} \end{bmatrix} \quad (0.28)$$

Once the offset for each port is calculated the gains are determined as follows.

$$\begin{bmatrix} g_n(1) \\ \vdots \\ g_n(F) \end{bmatrix} = (\underline{\Omega}^T\underline{\Omega})^{-1}\underline{\Omega}^T \cdot [\underline{b}_n - \underline{1} \cdot a_n] \text{ where} \quad (0.29)$$

$$\underline{\Omega} = \begin{bmatrix} \underline{D}_1 \\ \vdots \\ \underline{D}_C \end{bmatrix}. \quad (0.30)$$

$$\underline{D}_c = \text{diag}([P_{in}[c]|s_{n1}(1)|^2 \cdots P_{in}[c]|s_{n1}(F)|^2]) \quad (0.31)$$

Note that diag(.) is the expression for creating a diagonal matrix from each element of the input vector. Therefore $\underline{D}_c$ is an F×F diagonal matrix.

Referring now to FIG. 1, it has been found that one can use the power outputs of a multi-port junction to form the basis for an Inverse Fourier Transform to obtain distance to faults in a transmission line or waveguide. Thus, in one embodiment a frequency domain reflectometer includes a multi-port junction 10 coupled to a module 11, which estimates the reflection coefficient based on multi-port junction outputs. The estimated reflection coefficient is coupled to an Inverse Fourier Transform 12. In the illustrated embodiment the multi-port junction is a conventional six-port junction. One port, port 14, of the multi-port junction is connected to a transmission line under test 16. The transmission line may be either a cable or a waveguide. In one embodiment the transmission line may be terminated with a 50-Ohm resistor 18, nothing noting that the system will work equally well with an unterminated cable or transmission line. Port 20 of junction 10 is provided with a signal source 22, which in one embodiment sweeps through a number of frequency bands, with the output of signal source coupled to the cable under test through the six-port junction.

The power outputs of the multi-port junction are converted to a reflection coefficient or Γ(f), which is coupled to the Inverse Fourier Transform to convert the frequency domain representation of the reflection coefficient into a time domain representation. The time domain representation exhibits peaks that when graphed against time indicate the distance to a fault in the transmission line under test. For this purpose a module 24 that calculates distance to a fault is coupled to a display 26 so as to identify faults, as well as the distance thereto.

The output of the Inverse Fourier Transform is also applied to a module 28, which calculates the return loss at each of the detected peaks. Return loss is a measurement of the severity of the fault or the percent of energy reflected at the fault back to the source.

Figure 2:
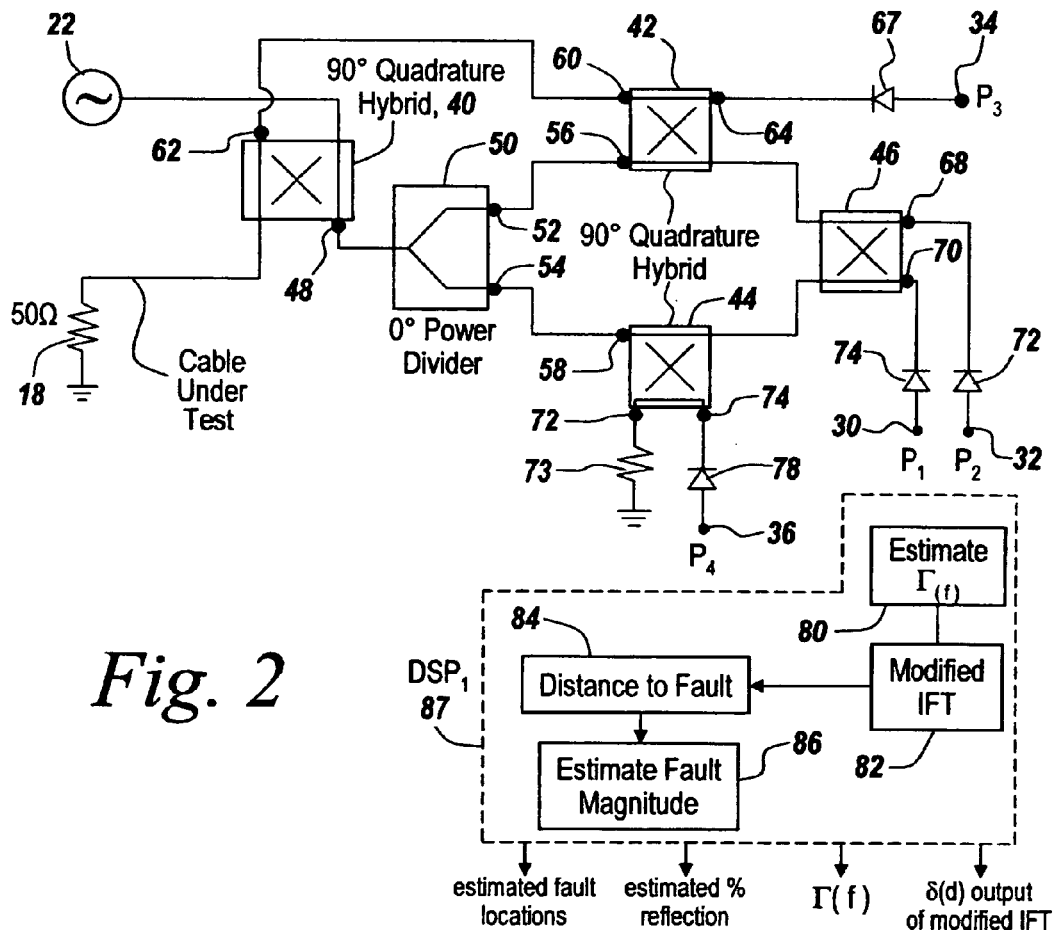
FIG. 2 is a diagrammatic illustration of the utilization of a six-port junction coupled to a frequency source and a cable under test to determine the distance to a fault and estimate the magnitude of the fault by detecting the power at four of the output ports of the six-port junction, also illustrating the utilization of a modified Inverse Fourier Transform.

Referring now to FIG. 2, while numbers of different multi-port junctions can be used, in one embodiment the six-port junction is discussed in which the multi-port junction 10 includes test port 14 and the signal source port 20.

As will be seen, the output power from the six-port junction is available at ports 30, 32, 34 and 36, respectively P1, P2, P3 and P4.

The six-port junction includes 90° quadrature hybrids 40, 42, 44 and 46, with an output 48 of hybrid 40 being coupled to a 0° power divider 50 having outputs 52 and 54 respectively coupled to ports 56 and 58 of hybrids 42 and 44.

Hybrid 42 at port 60 is provided with a signal from hybrid 40 at its port 62, with port 64 of hybrid 42 providing the P3 power output as detected by a diode detector 67.

Output ports 68 and 70 of hybrid 46 are coupled to respective diode detectors 72 and 74 so that the power P1 and P2 available at ports 68 and 70 can be measured.

For hybrid 44, output port 72 is connected by a 50-Ohm resistor 73 to ground, and output port 74 is coupled through diode 78 so that P4 can be measured.

The detected output power from the six-port junction available at P1, P2, P3 and P4 is coupled to a unit 80, which estimates the reflection coefficient Γ as a function of frequency. As will be seen, this unit or module utilizes an offset parameter and a gain parameter, the importance of which will become evident.

These estimates are coupled to a modified Inverse Fourier Transform module 82, the output of which is coupled to a module 84 that calculates the distance to the faults. Having found the distance to the faults, a module 86 is used to estimate the fault magnitude for each of the faults.

As will be appreciated, the functions of modules 80, 82, 84 and 86 can be carried out in a Digital Signal Processor illustrated by dotted line 87, such that the outputs of DSP 87 can include estimated fault locations, estimated percent reflections from each detected fault, the complex frequency response of the device under test and the γ(d) output of the modified IFT. Please also delete the δ(d) from the bottom of FIG. 2, and just make it say "output of modified IFT".

Figure 3A:
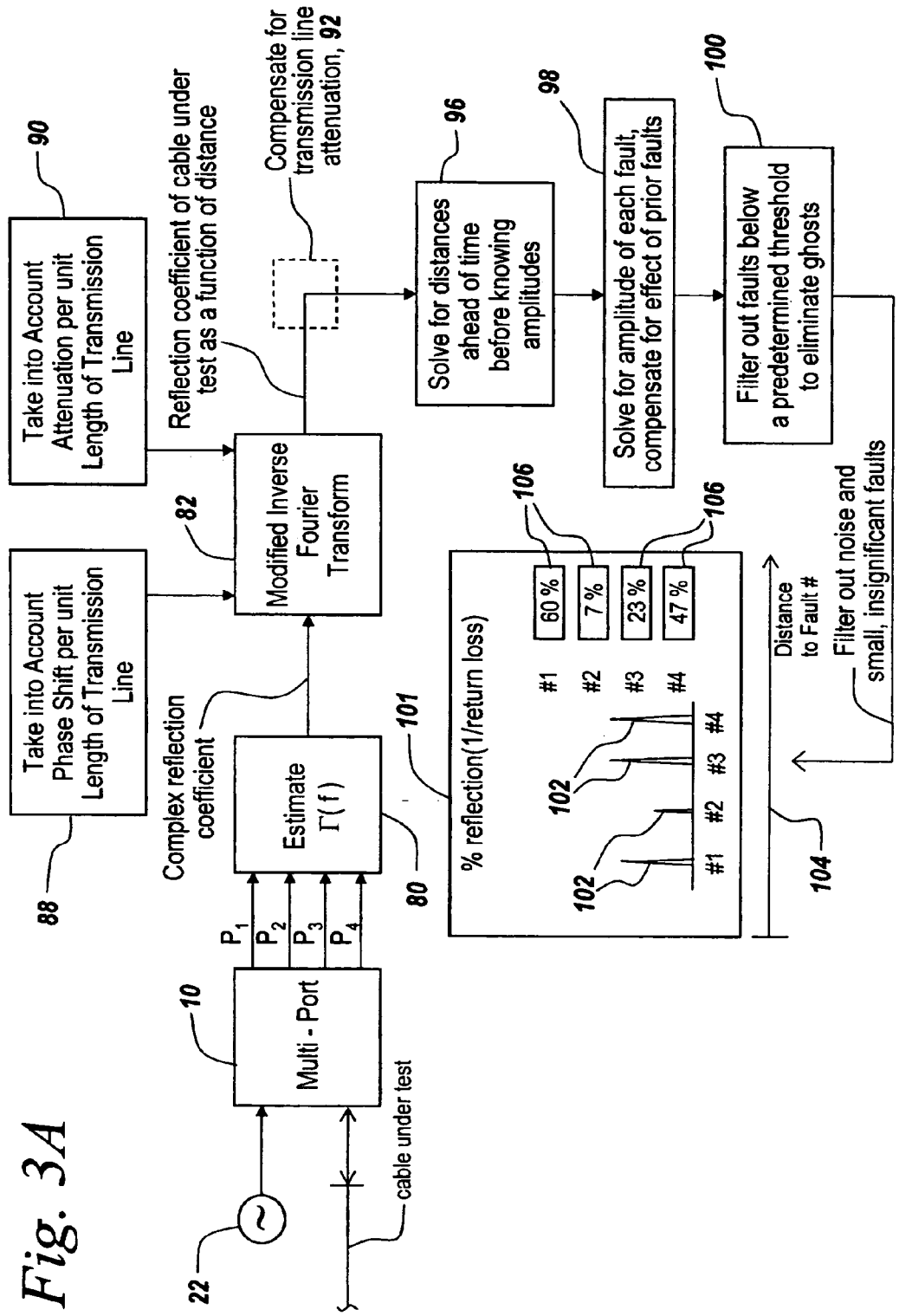
FIG. 3A is a block diagram illustrating the multi-port junction of FIGS. 1 and 2 coupled to a module for estimating the complex reflection coefficient based on output power from four ports of the junction, and applying a modified Inverse Fourier Transform to take into account attenuation per unit length of transmission line, also showing a system for filtering out faults below a predetermined threshold so as to present on a display real faults and the magnitude of the faults.

In general, and referring now to FIG. 3A, the P1, P2, P3 and P4 outputs of the six-port junction are applied, in one embodiment, to module 80 that estimates the reflection coefficient as a function of frequency. In this embodiment the result is a complex reflection coefficient, as opposed to the absolute magnitude coefficient of the prior art. The complex reflection coefficient is a function of frequency coupled to modified Inverse Fourier Transform module 80 to produce a time domain reflection coefficient as a function of distance that takes into account not only the phase shift per unit length of transmission line as illustrated at 88, but importantly takes into account attenuation per unit length of transmission line as illustrated at 90.

Taking into account attenuation per unit length of transmission line eliminates the necessity for compensating for transmission line attenuation after the IFT, as indicated by dotted box 92, which is not used in the subject system. Since attenuation per unit length of transmission line is a factor in obtaining appropriate results of the IFT, it is of great advantage to take into account the attenuation per unit length of transmission line in the Inverse Fourier Transform itself.

Figure 3B:
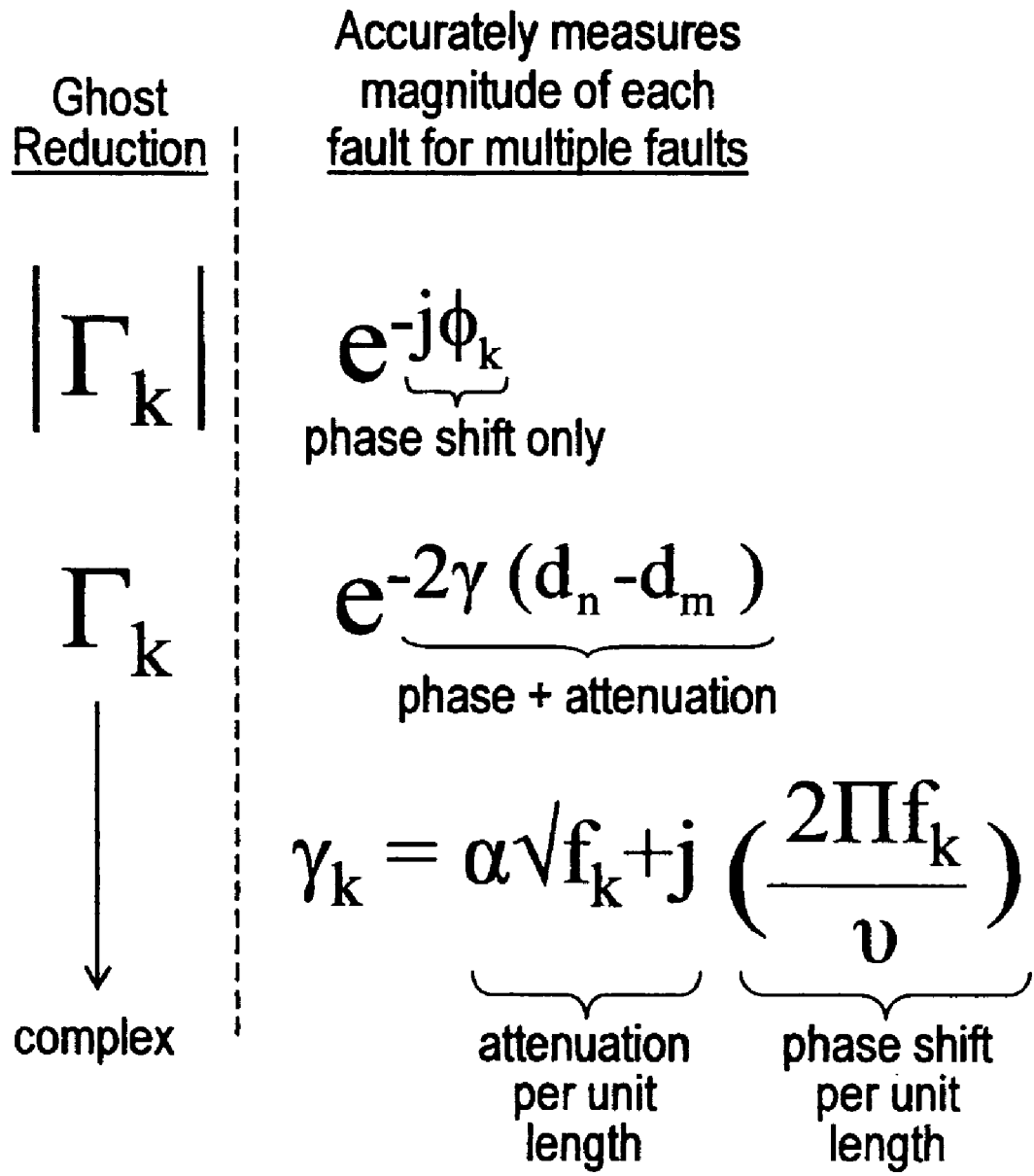
FIG. 3B is a diagrammatic representation of the utilization of a complex value of the reflection coefficient to reduce ghosts, and the utilization of an expression to which e is raised which takes into account attenuation per unit length.

Referring to FIG. 3B, while $e^{-j\Phi_k}$ was that on which Inverse Fourier Transforms operated in the past, this only measures phase shift as opposed to phase shift plus attenuation.

On the other hand, the portion of the reflection coefficient of Equation 0.1 indicates that e is raised to a complex value, namely $e^{-2\gamma_k d_m}$ where $\gamma_k$ is defined as $\alpha\sqrt{fk}+j2\pi fk/v$. As can be seen, $\gamma_k$ takes into account $\alpha$ and v, where $\alpha\sqrt{f_k}$ refers to attenuation per unit length and $j2\pi fk/v$ to phase shift per unit length of transmission line. Thus, the term $e^{-\gamma(dn-dm)}$ incorporates both phase information and attenuation information directly in the Inverse Fourier Transform, with the equation in FIG. 3B being derived from Equation 0.4.

Thus the reflection coefficient $\Gamma(f)$ is a complex reflection coefficient of the entire cable or waveguide, which can be used to derive the scattering parameters of the individual faults themselves.

It is important to note that, if one does not use the modified Inverse Fourier Transform, herein called the Taylor Transform, one generates peaks with errors related to the amplitudes of prior faults. Any attempt to apply a gain that tries to compensate for the transmission line attenuation causes one to detect peaks with incorrect amplitudes.

While the above discussion of FIG. 3B relates to the accuracy of measuring fault amplitude in a multi-fault environment, elimination of ghosts is accomplished in the subject invention by measuring $\Gamma_k$ as a complex value. In the past, frequency domain reflectometers measured only the absolute value of $\Gamma_k$, i.e., $|\Gamma_k|$. By using a complex value for $\Gamma_k$ one can eliminate the non-linear absolute value operation, thereby eliminating a source of ghosts, for instance, from the sum and difference values created by multiple reflections.

Having taken into account line attenuation, there is nonetheless the problem of eliminating noise, secondary reflections and inconsequential peaks that are due to prior faults to the one that has been identified. Thus, in order to eliminate the noise, secondary reflections and inconsequential peaks, one essentially has to threshold out the effect of previous faults. In order to do this, in one embodiment one first solves for distances ahead of time before knowing amplitudes, as illustrated at 96. In this two-step process, once knowing where the faults are, one then solves for amplitude of each fault as illustrated at 98. With each fault now having an amplitude or magnitude, one can threshold out those magnitudes below some predetermined threshold as illustrated at 100.

The output of thresholding circuit 100 is coupled to a display 101 that displays amplitude peaks 102 along a timeline corresponding to distance to a fault as illustrated at 104. The particular faults are indicated by #1, #2, #3 and #4. The severity of the faults is indicated at 100 to be either percent reflection or return loss, with the higher the percent reflection the lower the return loss.

It will be appreciated that the amplitude of the faults alone does not necessarily correlate to the percent reflection at each of the faults. However, as illustrated at 106, the percent reflection for each of the numbered faults is calculated and displayed so that an operator can ascertain not only the distance to each of the faults but also their severity.

Figure 4A:
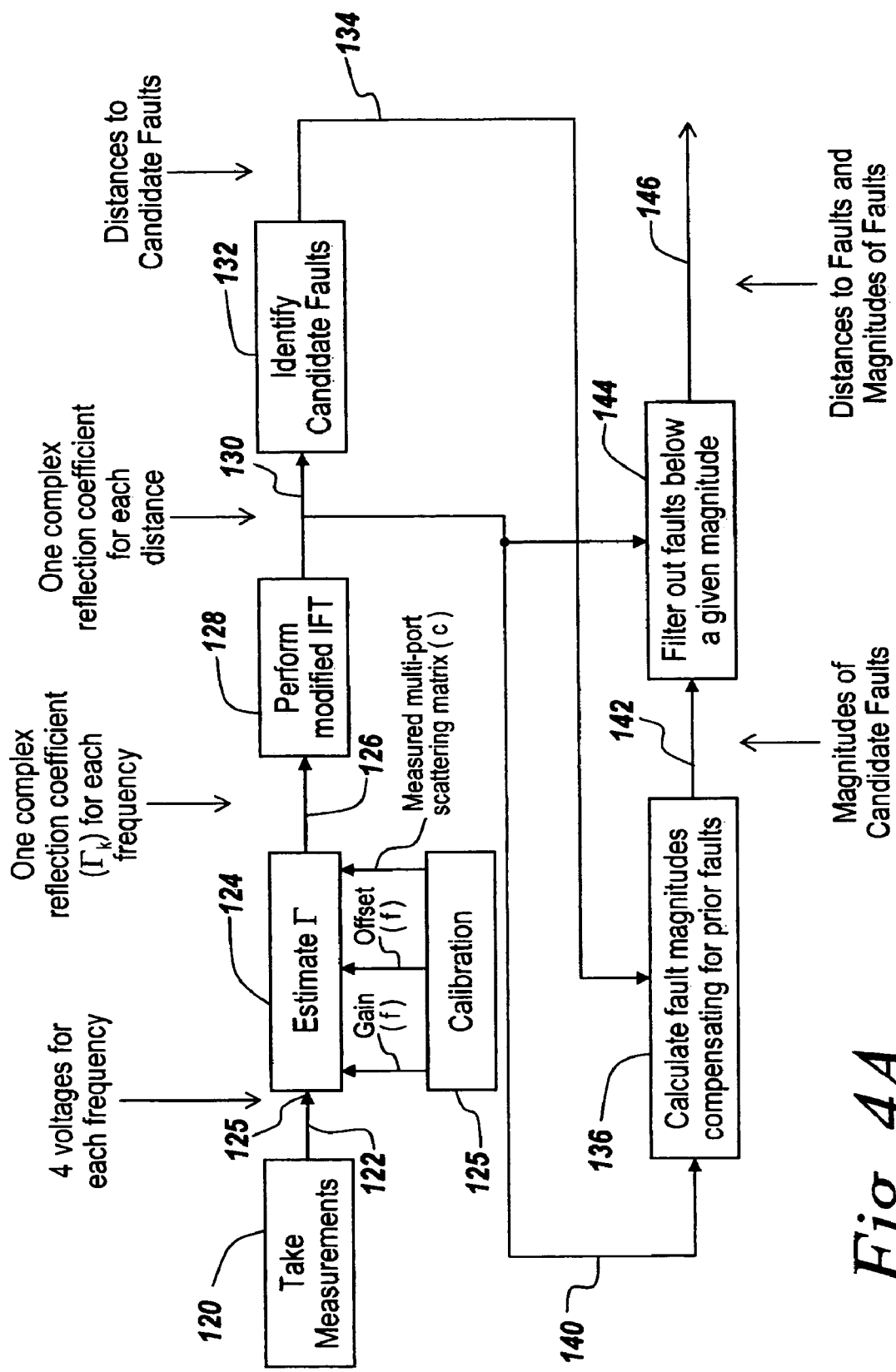
FIG. 4A is a block diagram illustrating the calibration of the reflectometer by setting gain and offset in the reflection coefficient estimator, also utilizing the measured multi-port scattering matrix, and performing a modified Inverse Fourier Transform to generate one complex reflection coefficient for each distance, followed by identifying candidate faults, calculating fault magnitudes compensating for prior faults, and filtering out faults below a given magnitude.

More particularly and referring now to FIG. 4A, in one embodiment of the subject invention, as illustrated at 120, one obtains measurements of the powers from the multi-port junction and in one embodiment outputs four voltages over line 122 to a module 124 that estimates a complex reflection coefficient $\Gamma(f)$ for each frequency. The estimation of the complex reflection coefficient is given by $$\Gamma(f) = \arg\min \sum_{n=3}^{6} \left\| b_n(f) - \hat{b}_n(f, \Gamma(f)) \right\|^2 \tag{0.32}$$

for a six-port circuit. Note that n denotes the output port index of the six-port circuit, $b_n(f)$ denotes the measurements out of the $n^{th}$ A/D port and refers to the power out of the $n^{th}$ port of the six-port circuit as measured by the detection circuit. Finally, $\hat{b}_n(f,\Gamma(f))$ is the model of each A/D output signal as a function of the unknown complex reflection coefficient $\Gamma(f)$.

Therefore, from this equation one can see that to estimate the complex reflection coefficient of the transmission line one must select the value of $\Gamma(f)$ for each frequency that minimizes the square error between the measured signals and the model. There are many techniques known to people skilled in the art, that can be applied to efficiently perform this optimization. However the specific optimization techniques that can be applied are dependant on the structure of the signal model.

In the case of the a multi-port circuit connected to detection circuitry which includes power detectors and A/D converters, as described in this invention, the signal model can take one of two forms. These two forms depend on whether square law or log power detectors are employed in the detection circuitry. These two signal models are defined below for both square law and log detector configurations respectively.

Square Law Detector $$\hat{b}_n(f,\Gamma(f))=g_n(f)\cdot(\alpha_n(f)|\Gamma(f)|^2+\beta_n(f)Re\{\Gamma(f)\}+\gamma_n(f)Im\{\Gamma(f)\}+\delta_n(f))+a_n(f) \tag{0.33}$$

Log Detector $$\hat{b}_n(f,\Gamma(f))=g_n(f)\cdot LOG_{10}(\alpha_n(f)|\Gamma(f)|^2+\beta_n(f)Re\{\Gamma(f)\}+\gamma_n(f)Im\{\Gamma(f)\}+\delta_n(f))+a_n(f) \tag{0.34}$$

Here $\alpha_n(f)$, $\beta_n(f)$, $\gamma_n(f)$ and $\delta_n(f)$ are known parameters that are functions of the complex scattering parameters $s_{nm}(f)$ of the multi-port circuit and are also functions of the nominal RF source power $P_s$. These relationships are defined in equations 0.15-0.18 above.

Notice that after substitution of the variables of Equations 0.15-0.18 into equations 0.33 and 0.34 one can see that both signal models are functions of the complex scattering parameters $s_{nm}(f)$ of the six-port circuit as measured during factory calibration and are also functions of the gains and offsets, $g_n(f)$ and $a_n(f)$ that are estimated during the field calibration process.

Taking the measurements from each port and subtracting the model for each port yields an error for every trial of $\Gamma(f)$, which when squared and summed over each port yields the total square error for every trial of $\Gamma(f)$. One then uses the $\Gamma(f)$ that results in the minimum error. Based on the system models shown in Equations 0.33 and 0.34 one can employ non linear least squares optimization techniques to determine the values of $\Gamma(f)$ that best minimize the square error between the measurements and the model. One method in particular that can be employed is the Newton search algorithm. This is an algorithm that can optimize Equation 0.32 by employing a computationally efficient searching technique.

It is noted that when log detectors are employed one may choose to first pre-process the measured data to remove the effects of the gains and offsets and logarithm. This process is equivalent to solving the following optimization problem in place of the one defined in equation 0.32.

$$\Gamma(f) = \arg\min \sum_{n=3}^{6} \left\| 10^{\left(\frac{b_n(f)-a_n(f)}{10g_n(f)}-3\right)} - 10^{\left(\frac{\hat{b}_n(f,\Gamma(f))-a_n(f)}{g_n(f)}\right)} \right\|^2 \qquad (0.35)$$

Notice that on the left side of the subtraction the gains offsets and affects of the logarithm are removed from the measured signals. Also notice that the model denoted by the right hand side of the subtraction also has the gains offsets and logarithm effects removed. This approach is valid as long as the amount of noise riding on the measured signals is low compared to the signals themselves. This is the case in most applications. Thus using this technique will also produce favorable results.

In estimating the complex reflection coefficient $\Gamma(f)$, module 124 takes into account gains, offsets and a scattering matrix from a calibration step 125. The scattering matrix is derived from a factory calibration process using a network analyzer. The gains and offsets are derived in the field from using one of two internal calibration techniques, one with RLC loads, and the other involving attenuators that are switched in ahead of the multi-port circuit.

Figure 6:
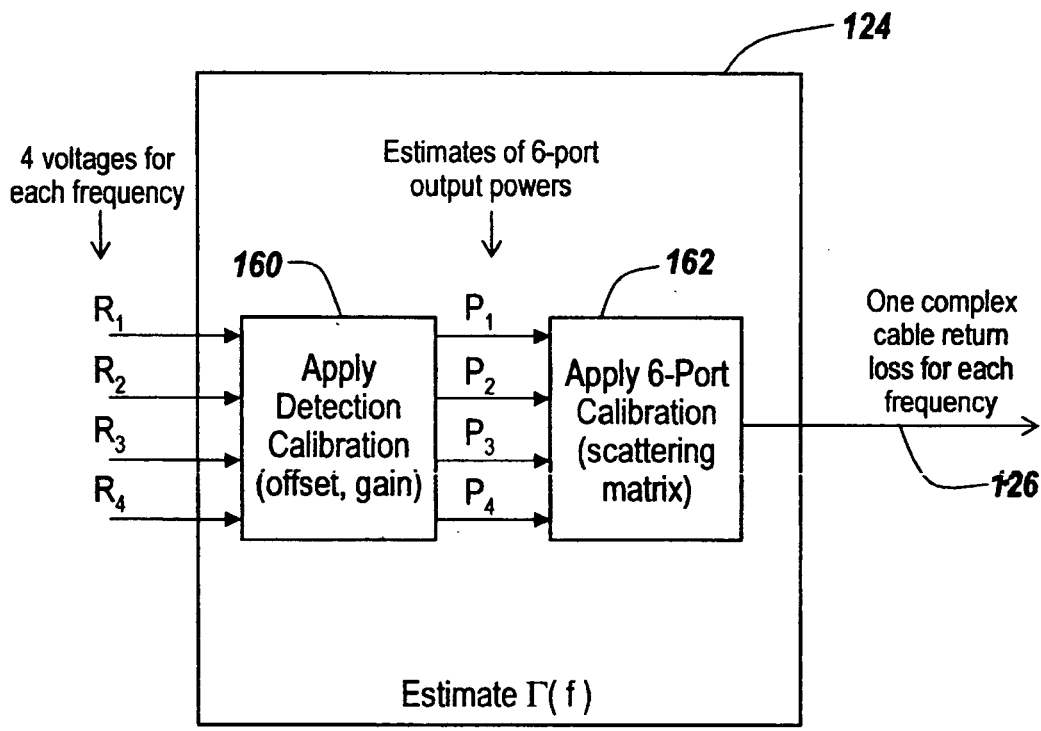
FIG. 6 is a block diagram of the estimation of the reflection coefficient associated with the four voltages generated in FIG. 5 in which the calibration of FIGS. 4A and 4B is accomplished in two stages, the first to re-calculate offset and gain based on measurements in the field, and the second to apply a six-port calibration involving a pre-measured scattering matrix for the six-port junction.

In equation 0.35 the gains offsets and the affects of the logarithm are removed from the measured signals $b_n(f)$ prior to minimizing the square error between the signal and the model. As equation 0.35 shows the model on the right side of the subtraction also has the effects of the gains, offsets and logarithm removed. Therefore, it incorporates the measured scattering parameters of the multi-port circuit and the known RF source power level. Thus both the factory measurements and the field measurements constitute the calibration as can be seen in FIG. 6. This applies to both calibration techniques when log detectors are employed.

For a four-port circuit the estimation of the complex reflection coefficient $\Gamma(f)$ is given by $$\hat{\Gamma}(f) = \frac{H\{y(f)\}}{D(f)} \qquad (0.36)$$

where H{ } denotes the Hilbert transform and is applied once given $y(f)$ for all measured frequencies "f". In this equation $y(f)$ is generated by altering the output measurements for each port as follows.

For log detectors $$y(f) = \frac{10^{\left(\left(\frac{b_3(f)-a_3(f)}{10g_3(f)}\right)-3\right)} - \delta_3(f)}{\alpha_3(f)} - \frac{10^{\left(\left(\frac{b_4(f)-a_4(f)}{10g_4(f)}\right)-3\right)} - \delta_4(f)}{\alpha_4(f)} \qquad (0.37)$$

For square law detectors $$y(f) = \frac{b_3(f) - (g_3(f)\cdot\delta_3(f) + a_3)}{g_3(f)\alpha_3(f)} - \frac{b_4(f) - (g_4(f)\cdot\delta_4(f) + a_4)}{g_4(f)\alpha_4(f)} \qquad (0.38)$$

$D(f)$ is a function of the scattering parameters of the multi-port circuit and the RF source power and is defined as follows $$D(f) = \left(\frac{\beta_3(f)}{\alpha_3(f)} - \frac{\beta_4(f)}{\alpha_4(f)}\right) - j\left(\frac{\gamma_3(f)}{\alpha_3(f)} - \frac{\gamma_4(f)}{\alpha_4(f)}\right) \qquad (0.39)$$

In these equations $g_n(f)$ and $a_n(f)$ denote the gains and offsets respectively, estimated during field calibration. $\alpha_n(f)$, $\beta_n(f)$, $\gamma_n(f)$ and $\delta_n(f)$ are known parameters that are functions of the complex scattering parameters $s_{nm}(f)$ of the multi-port circuit and are also functions of the nominal RF source power $P_s$. These relationships are defined in equations 0.15-0.18 above.

It is important to note that this approach differs significantly from conventional approaches for estimating the complex reflection coefficient when, for example a six-port RF circuit is employed. When using a six-port circuit one has four output power measurements for each frequency that can be used to unambiguously determine the complex reflection coefficient. In this approach the complex reflection coefficient is calculated independently for each frequency. The solution given in equation 0.36 for use with a four-port circuit on the other hand, uses the Hilbert transform to compute the complex reflection coefficient across all frequencies in one step. This is necessary when using a four-port circuit because at each frequency the value for the complex reflection coefficient could be one of two values. To remove this ambiguity the Hilbert transform is used to apply a constraint that across frequency the real and imaginary component of the complex reflection coefficient profile have the same profile with a ninety degree phase shift between them. This constraint is valid because the components that make up the transmission line under test and the four-port circuit also follow the same physical principle. Therefore, by applying this technique one removes the ambiguity at each frequency and can correctly estimate the complex reflection coefficient profile.

For clarification of the steps performed in 0.36-0.39, by using the signal models in equations 0.33 and 0.34 in place of the measurements $b_n(f)$ one can define a model for $y(f)$ denoted $\hat{y}(f)$.

$$\hat{y}(f) = \text{Re}\left\{\left(\left(\frac{\beta_3(f)}{\alpha_3(f)} - \frac{\beta_4(f)}{\alpha_4(f)}\right) - j\left(\frac{\gamma_3(f)}{\alpha_3(f)} - \frac{\gamma_4(f)}{\alpha_4(f)}\right)\right)\Gamma(f)\right\} \qquad (0.40)$$

Substituting equation 0.39 into 0.40 yields $$\hat{y}(f) = \text{Re}\{D(f)\Gamma(f)\} \qquad (0.41)$$

Thus by applying the Hilbert transform to $y(f)$ and then dividing by $D(f)$ as shown in equation (0.36) one obtains an estimate for the complex reflection coefficient $\Gamma(f)$ for the transmission line under test at each frequency.

It is the purpose of the $\Gamma$ estimation module to provide one complex reflection coefficient ($\Gamma_k$) for each frequency. As illustrated at 128, one performs the aforementioned modified IFT, the output of which on line 130 is applied to a unit 132, which identifies the candidate faults and more particularly identifies the distances to the candidate faults without, for instance, calculating the magnitude or amplitude of the fault. The results of the outputs of unit 132 are the distances to the candidate faults, which are outputted on line 134 and are applied to a unit 136 that calculates the fault magnitudes, compensating for prior faults. It is noted that the complex reflection coefficient for each distance is inputted over line 140 so that the fault magnitude calculation can proceed.

The output of module 136 over line 142 is the magnitude of the candidate faults. These magnitudes are input to a thresholding filter 144, which filters out faults below a given magnitude. The results, as illustrated on line 146, are the distances to the faults that are above the threshold and the magnitudes of the faults, with faults under a predetermined magnitude being removed.

Figure 4B:
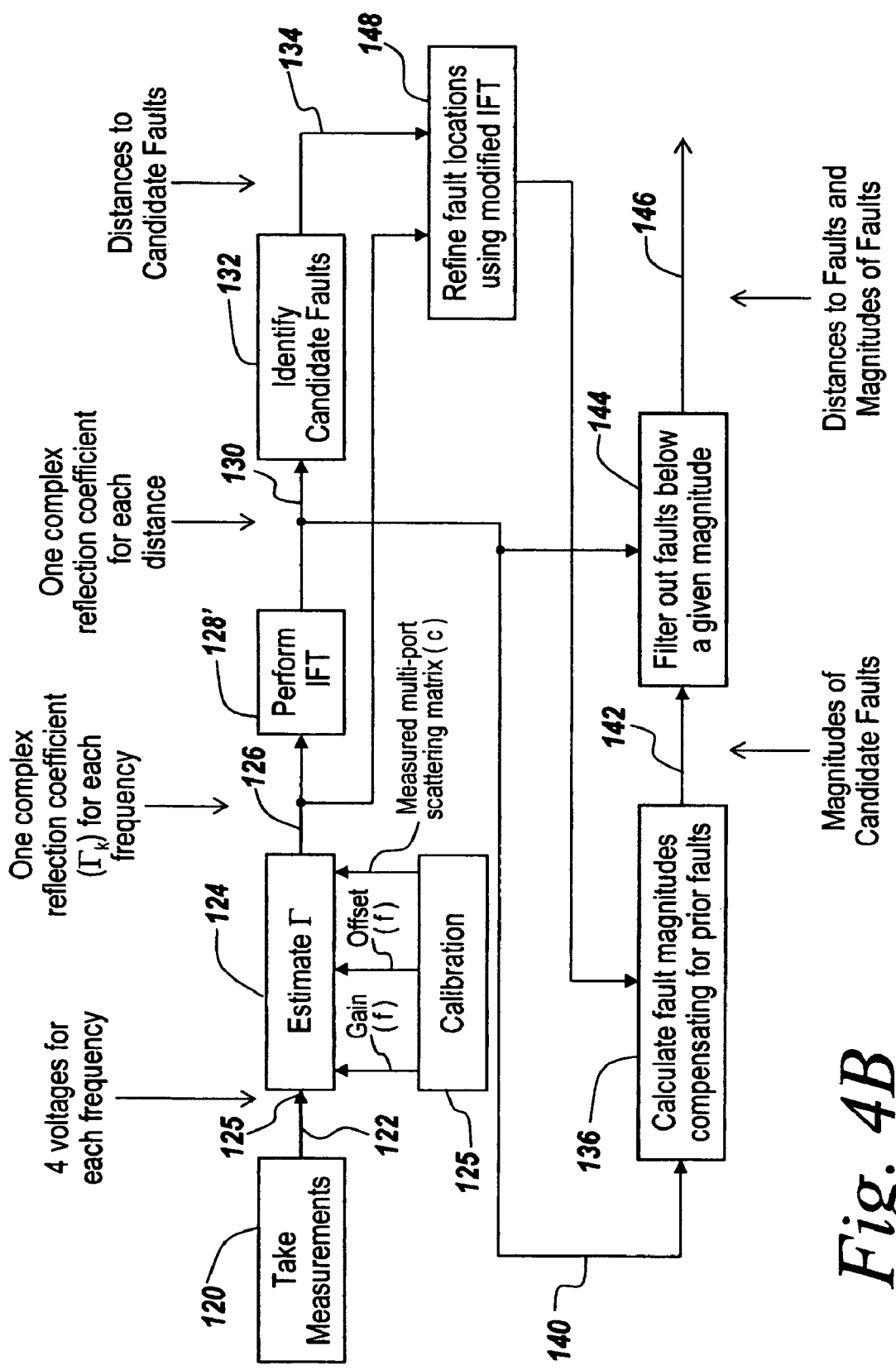
FIG. 4B is a block diagram illustrating first performing an Inverse Fourier Transform on each complex reflection coefficient for each frequency, identifying candidate faults and refining fault locations using a modified Inverse Fourier Transform, thus to reduce computational complexity.

Because the system of FIG. 4A may be computationally intense and referring now to FIG. 4B, a traditional Inverse Fast Fourier Transform 128' is substituted for the modified IFT 128 of FIG. 4A to speed up the initial processing. Secondly, a module 148 is interposed in line 134 to refine fault locations from unit 132. It is module 148 that now employs the modified IFT using the Taylor algorithm. However, it operates on a much-reduced number of data points.

As to the operation of the unit that identifies candidate faults, the algorithm looks at the plot of the complex reflection coefficient versus distance. This plot will have a large number of peaks, most of them due merely to noise. A "peak" is mathematically defined as a location where the plot's slope changes from positive to negative. Thus, the algorithm identifies all of those peaks, the vast majority of them bogus.

The module that refines fault locations uses the modified Inverse Fourier Transform. However, there is an additional feature of this modified IFT algorithm. The problem is that the complex reflection coefficient vs. distance has some granularity. It is only calculated every "x" inches, for example, perhaps every 6 inches. But the actual fault may lie between two data points (i.e. at the 3" point). So if one were to calculate the fault magnitude based on the granular distance, then one would have some error due to that granularity. The refinement part of the modified Taylor Inverse Fourier Transform algorithm employed in FIG. 4B is that one calculates the modified IF for not only the candidate fault distance given, but also one adjusts the distance slightly in each direction around the candidate fault distance, and picks the distance that gives the largest modified inverse Fourier transform output. Then one goes on to the next candidate fault and does the same thing again for every candidate fault.

The motivation for using a traditional IFFT first to identify candidate faults is as follows:

The FIG. 4A embodiment used the modified IFT on the whole complex reflection coefficient vector, which can involve 4096 data points. This was found to be computationally intensive, so that the operator would have to wait a long time for the results. To work around this problem, in one embodiment a traditional IFFT is employed, which is very fast. The traditional IFFT can adequately identify the fault locations. However, the regular IFFT cannot accurately determine the magnitudes of the peaks.

To solve this problem the subject system takes the output of the IFFT and identifies the candidate faults, so that one ends up with some number of candidates that is much smaller than 4096. The modified IFT is then performed on that much smaller number of candidate faults, and it does not take nearly as long as when using the modified IFT of FIG. 4A. It has been found that the FIG. 4B reflectometer is of very reasonable computational complexity resulting in reasonable operator wait time.

Figure 5:
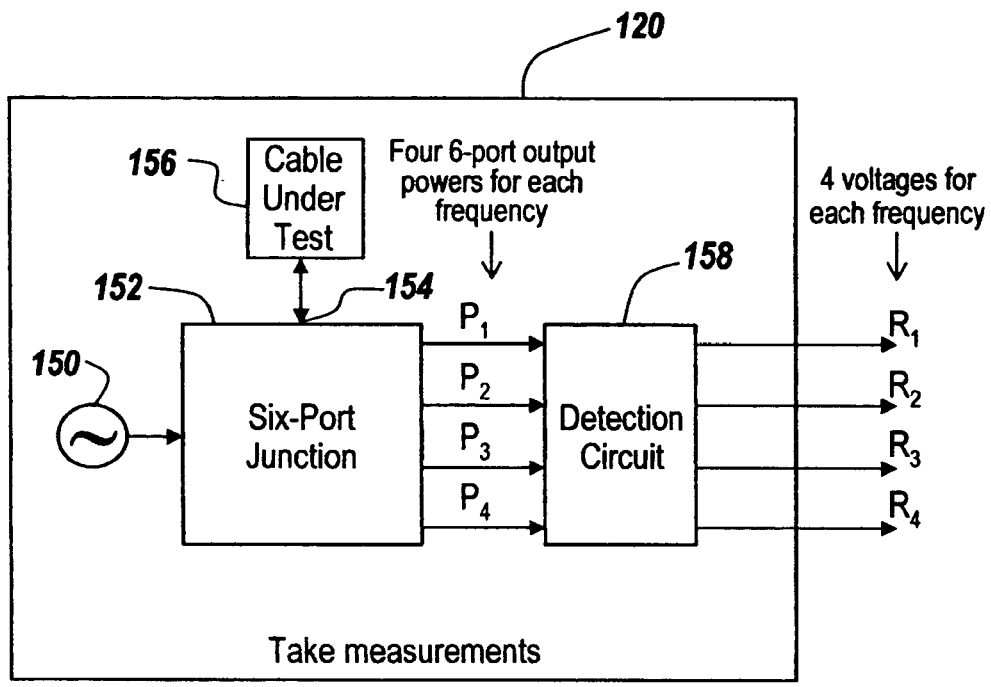
FIG. 5 is a block diagram of the module in FIGS. 4A and 4B that takes measurements, illustrating detection circuitry for detecting output power on four output ports of a six-port junction, thus to output four voltages for each frequency.

Referring to FIG. 5 and the FIG. 4A embodiment, with respect to the taking of measurements as illustrated at 120 in FIG. 4A, a signal source 150 is applied in one embodiment to a six-port junction 152, which has the test port thereof 154 coupled to a cable under test 156. The outputs of the six-port junction are four six-port output powers for each frequency, here labeled $P_1$, $P_2$, $P_3$ and $P_4$. These power outputs are applied to a detection unit 158, which converts the powers into four voltages, $R_1$, $R_2$, $R_3$ and $R_4$.

Prior to performing the modified IFT, as illustrated at 124, the four voltages for each frequency generated by detection circuit 158 are applied to a detection calibration module 160 within the complex reflection coefficient estimation unit 124. Detection circuit 158 takes into account offset and gain coefficients to provide an estimate of the six-port output powers, again here illustrated at $P_1$, $P_2$, $P_3$ and $P_4$. These powers are then applied to a six-port calibration module 162, which adjusts the complex reflection coefficient estimation in accordance with the factory testing that is done by a network analyzer. In other words, one takes into account the scattering matrix for the multi-port junction measured at the factory. The result, as illustrated on line 126, is one complex cable return loss or reflection coefficient for each frequency.

Figure 7:
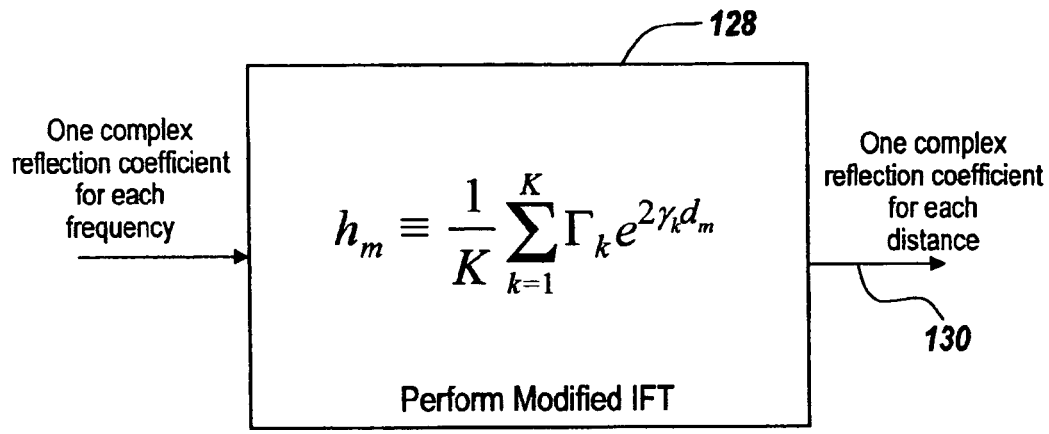
FIG. 7 is a diagrammatic illustration of the module in FIG. 4A that performs a modified Inverse Fourier Transform on complex reflection coefficients.

Referring to FIG. 7, module 128 performs the modified IFT so that, with one complex reflection coefficient for each frequency, one derives one complex reflection coefficient for each distance.

Figure 8:
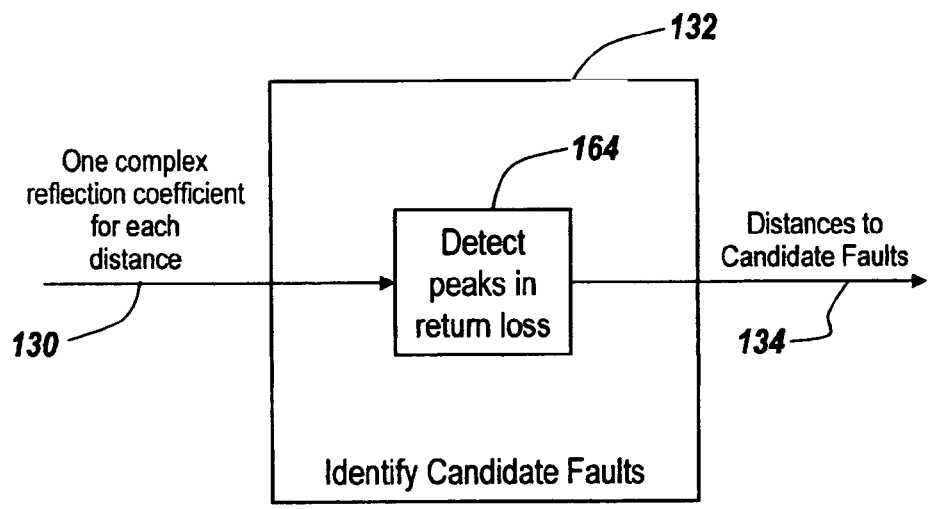
FIG. 8 is a diagrammatic illustration of the identification of candidate faults in FIGS. 4A and 4B in which candidate faults are identified utilizing peak detection algorithms.

As illustrated in FIG. 8, module 132 identifies the candidate faults by taking one complex reflection coefficient for each distance, namely one complex cable return loss for each distance, and applies it to a peak detector 164 to obtain distances to candidate faults that are outputted over line 134.

Figure 9:
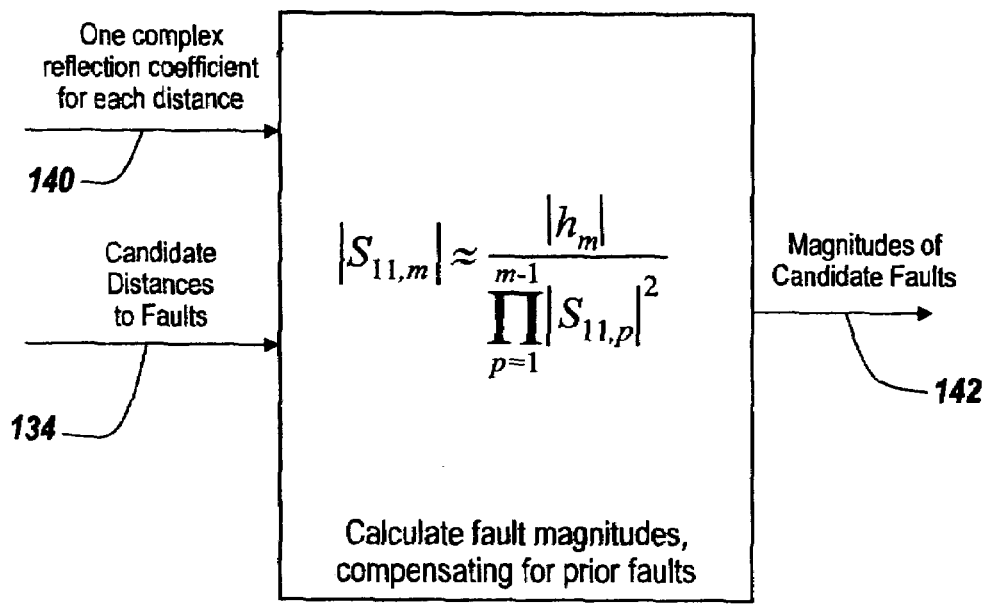
FIG. 9 is a diagrammatic illustration of the module in FIGS. 4A and 4B which calculates fault magnitudes compensating for prior faults, illustrating the algorithm used therefor.

As illustrated in FIG. 9, module 136 for calculating fault magnitudes compensating for prior faults includes inputs over lines 134 and 140, and through use of the transform illustrated, and computes the magnitudes of candidate faults as illustrated on line 142.

Figure 10:
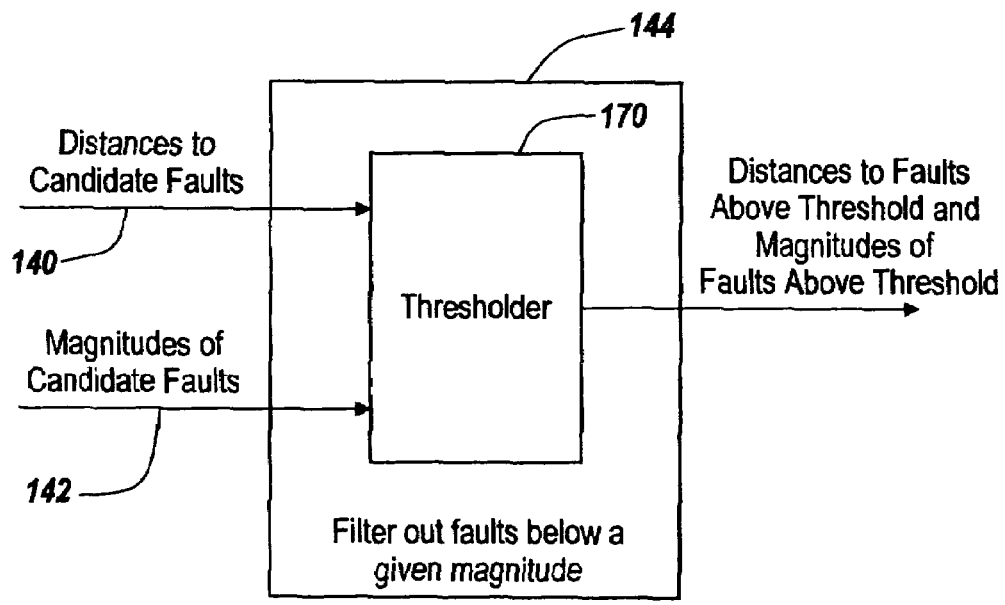
FIG. 10 is a diagrammatic illustration of the module in FIGS. 4A and 4B that filters out faults below a predetermined magnitude using a thresholding circuit, utilizing the magnitude of candidate faults from the unit that calculates magnitudes compensating for prior faults.

As illustrated in FIG. 10, thresholding circuit 144 includes a thresholding circuit 170, which for each of the faults has an input of the magnitude of the candidate faults over line 142 and distances to the candidate faults available over line 140.

The output of thresholder 170 is a series of faults with associated distances that magnitudes above the threshold.

In this manner, not only is noise eliminated and not only are ghosts eliminated, attenuation per unit length of transmission line is taken into account. Moreover, those faults that are insignificant or due to secondary reflection are eliminated.

Referring now to FIG. 11, what is provided for six-port operation is an equation in which there are several six-port network parameters, namely A, B and D, which determine the operation of the six-port junction. Here it will be noted that, in the factory, one can measure A, B and D and therefore measure $g_3$. It is these network parameters that do not change after factory characterization and which are plugged into module 162 of FIG. 6.

Referring to FIG. 12, the equation for the reflection coefficient is provided in which it can be seen that a certain portion of this equation incorporates attenuation, whereas another portion of this equation incorporates frequency or rotation. Frequency or rotation is equivalent to phase shift such that, as can be seen from the equation of FIG. 12, both attenuation and phase shift are accounted for.

Because attenuation and phase shift are accounted for in the modified IFT that is the subject matter of this invention, the accuracy of the measurement of the faults in a multi-fault environment is assured, since faults due to secondary reflections can be discriminated against.

Calibration

As mentioned hereinbefore, internal calibration makes possible the use of the multi-port junction without an undue burden on the part of the technicians making the cable measurements. Note that calibration will first be discussed when diode detectors are used. Thereafter the changes necessary when using log amplifiers will be discussed. The calibration can be accomplished in one of two ways, one by switchable loads at the cable under test port and the other by switchable attenuators interposed between the RF source and the multi-port junction. Both techniques yield the offset and gain used in the Γ estimation module 124 of FIG. 4.

a. Switchable Loads

Figure 13:
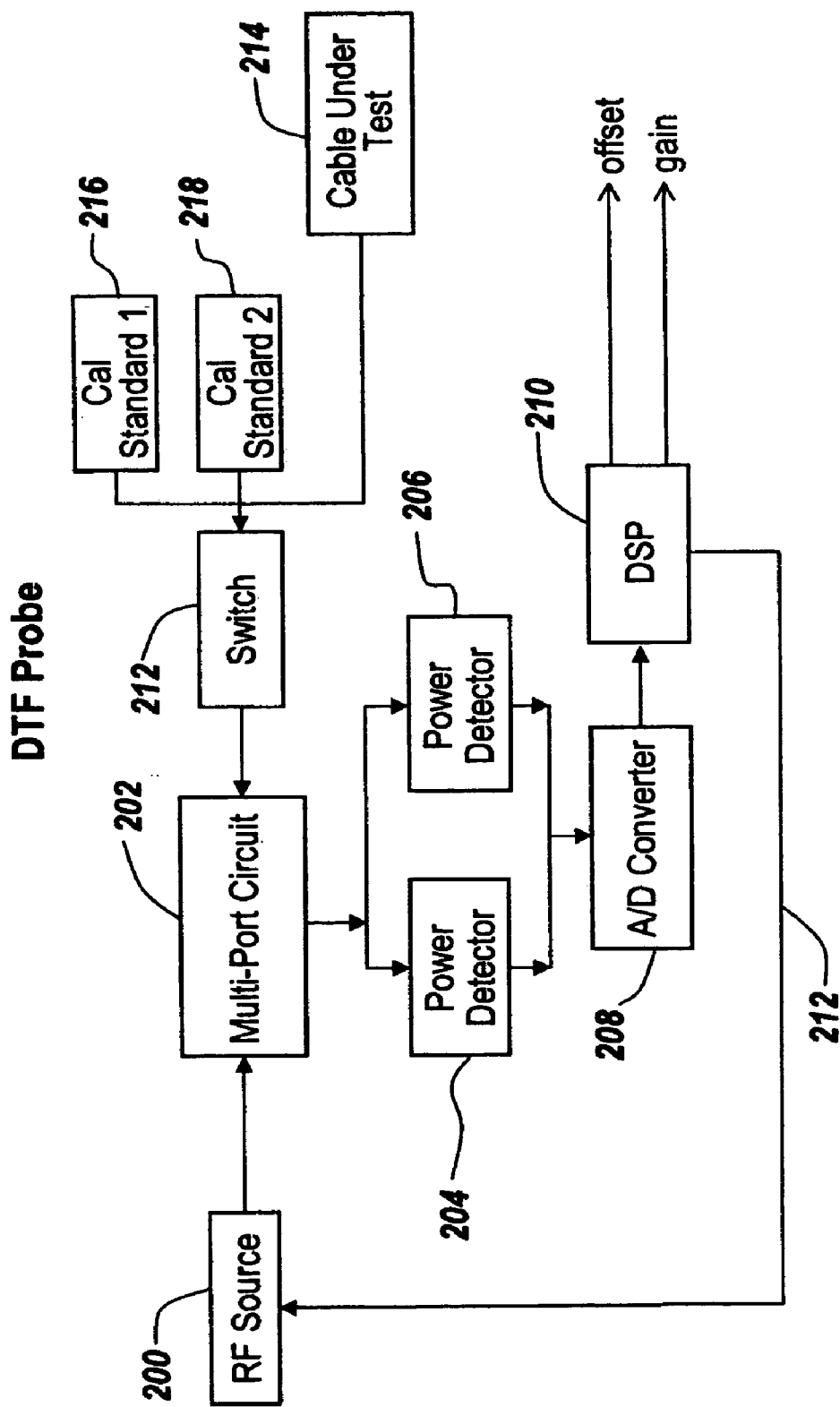
FIG. 13 is a block diagram illustrating the utilization of calibration standards switched to the cable test port of a multi-port circuit having the power output thereof as an input to a digital signal processor for determining offset and gain.

As can be seen in FIG. 13, an RF source 200 is coupled to a multi-port circuit or junction 202, which has the output powers thereof converted to voltages by power detectors 204 and 206. These voltages are measure by an analog-to-digital converter 208, which are then read by a digital signal processor 210.

Digital signal processor 210, as will be seen, takes measurements across a frequency range of interest for each calibration load. It does so at switch 212 by switching between a cable under test 214 and a first calibration standard 216 and a second calibration standard 218.

Figure 17:
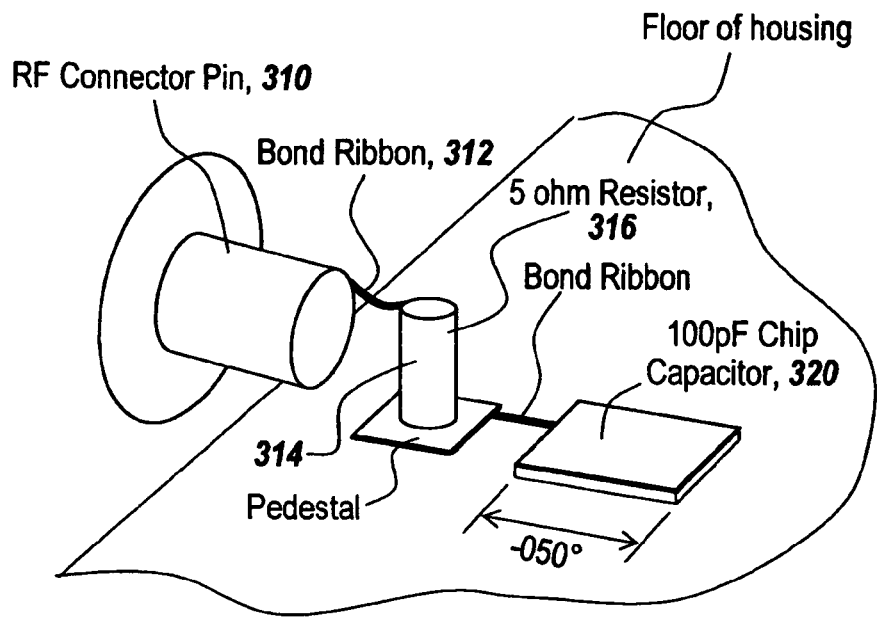
FIG. 17 is a diagrammatic illustration of an RLC circuit which can be switched as a calibration load to the test port of the reflectometer of FIG. 14; and, FIG. 18 is a schematic diagram of loads configured in accordance with FIG. 17 that can be switched to the test port of the reflectometer prior to switching the test port to the cable under test.
Figure 18:
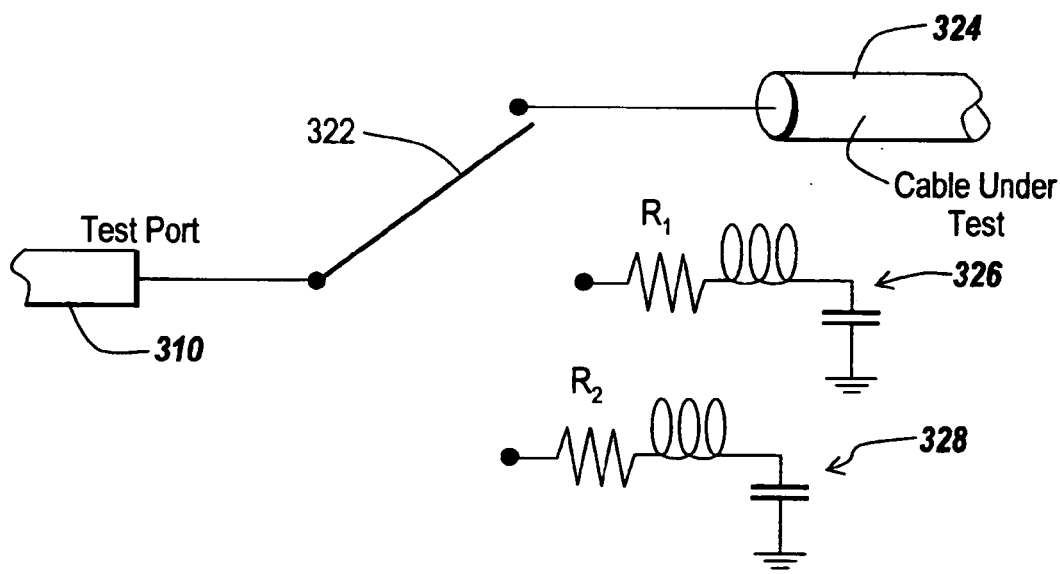

As will be described, these two calibration standards in one embodiment can be RLC circuits, such as shown in FIGS. 17 and 18.

b. Switchable Attenuators

Figure 14:
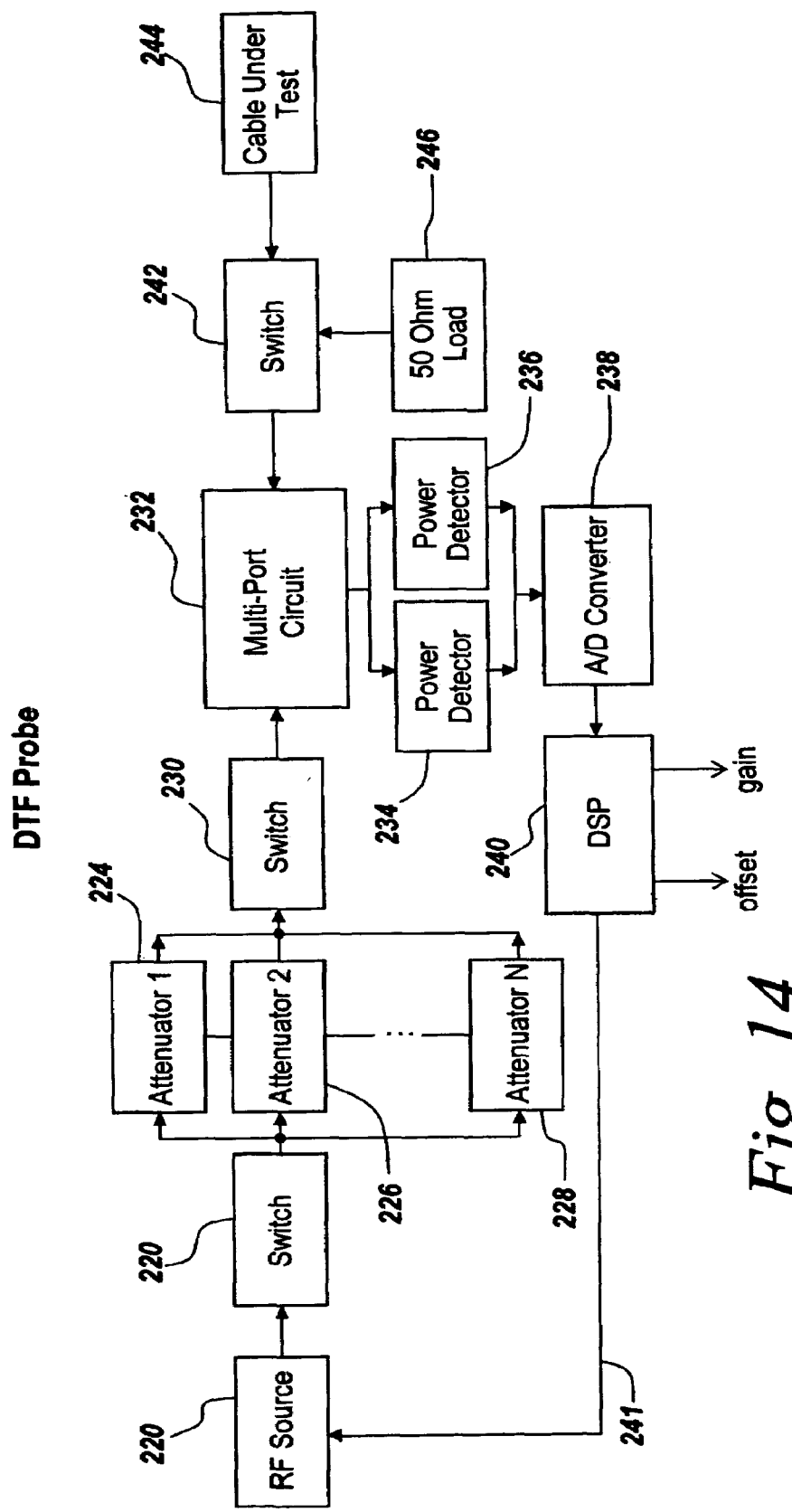
FIG. 14 is a block diagram of a calibration circuit utilizing calibration loads in the form of attenuators switched between an RF source and a multi-port circuit, with a digital signal processor providing offset and gain parameters.

While the use of two RLC circuits is one way to perform the internal calibration, as illustrated in FIG. 14, one can substitute a 50 ohm load onto the switch at the cable-under-test port and put attenuators between the RF Source and the RF Input port as in FIG. 13. The result is still the same in that one can obtain offsets in gains to calibrate the frequency domain reflectometer. Here an RF source 220 is attached to a switch 222 that switches in attenuators 224, 226, or 228, with the larger number of attenuators the better the calibration accuracy. Switch 230 completes the switching in of the various attenuators to the multi-port circuit 232. Again, the outputs of the multi-port circuit are provided to diode detectors 234 and 236, which are converted by an analog-to-digital converter 238 and are processed by digital signal processor 240. The outputs of the calibration procedure are the offsets and gains used by the complex reflection coefficient profile (Γ(f)) estimation module of FIGS. 4A and 4B.

Also provided is a switch 242 that switches between a cable under test 244 and a 50-Ohm load 246.

Figure 15:
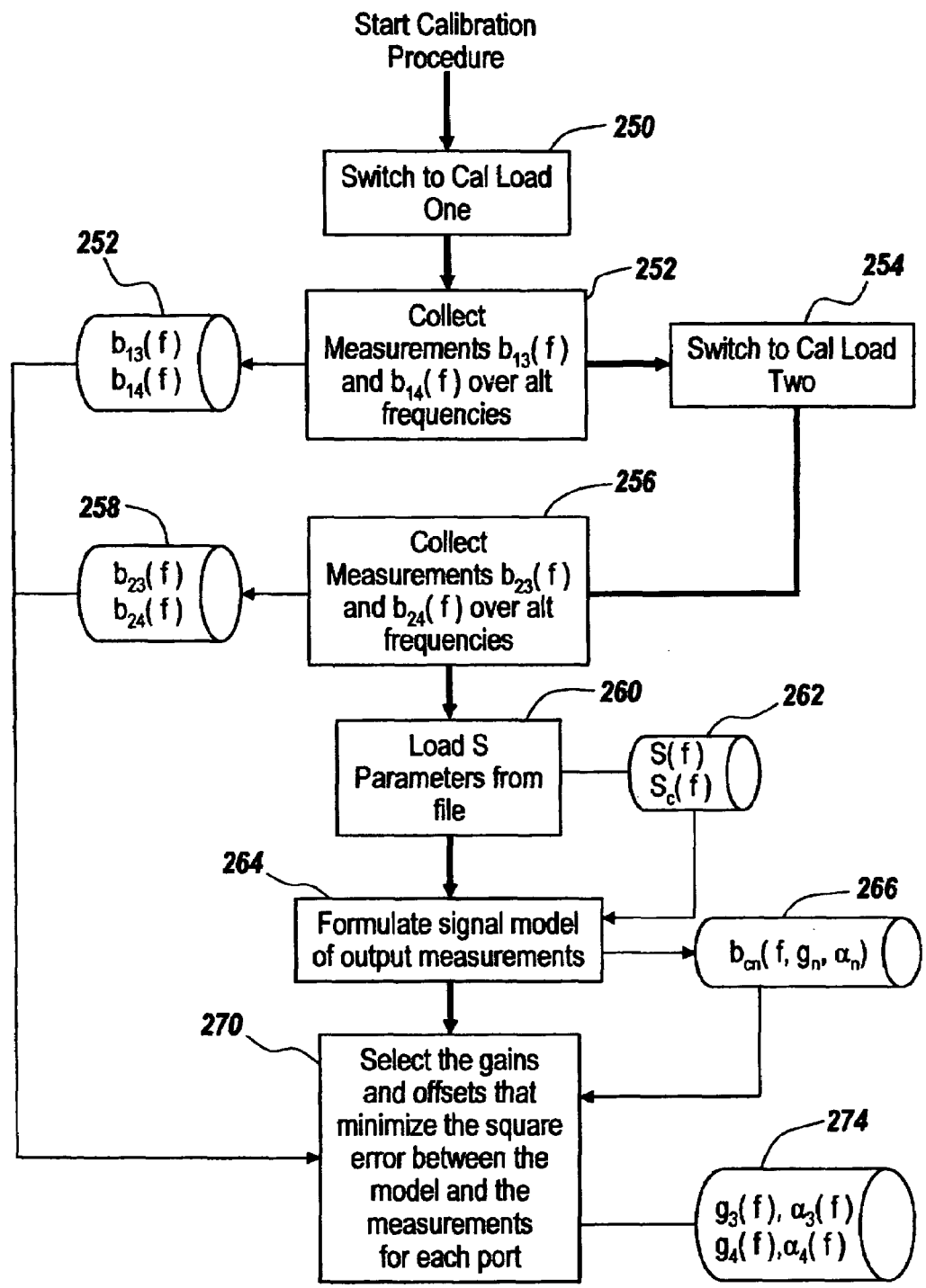
FIG. 15 is a flow chart for the calibration of the frequency domain reflectometer of FIG. 13 in which two calibration loads are sequentially coupled to the test port of the reflectometer and in which measured responses are compared with model circuit responses, thus to permit the calculation of gain and offset using a least square estimate.

In operation and referring now to FIG. 15, a flow chart is illustrated for the calibration procedure made possible by the use of two or more RLC calibration loads.

Here it can be seen at 250 that one switches to a first calibration load and then at 252 collects measurements of the output powers over all frequencies. The result of the collection of the measurements for the first calibration load is stored as illustrated at 252, at which point, as illustrated at 254, one switches to collect measurements of a second calibration load at 256. These output power measurements are taken over all test frequencies, with the collected measurements being stored as illustrated at 258.

As illustrated at 260, one then loads the multi-port S parameters and RLC load S parameters from a file, with the parameters being illustrated and stored as illustrated at 262. One then, as illustrated at 264, formulates the model of the output signals measured from each port given the multi-port S parameters and calibration load S parameters from the file. This model is a function of the gains and offsets that need to be estimated as illustrated at 266. As illustrated at 270, gains and offsets selected for the model at 266 that minimize the square error between this model and the measurements stored at 252 and 258 for each port respectively. The gains and offsets that minimize this square error are outputs of the calibration procedure as illustrated in 274.

Figure 16:
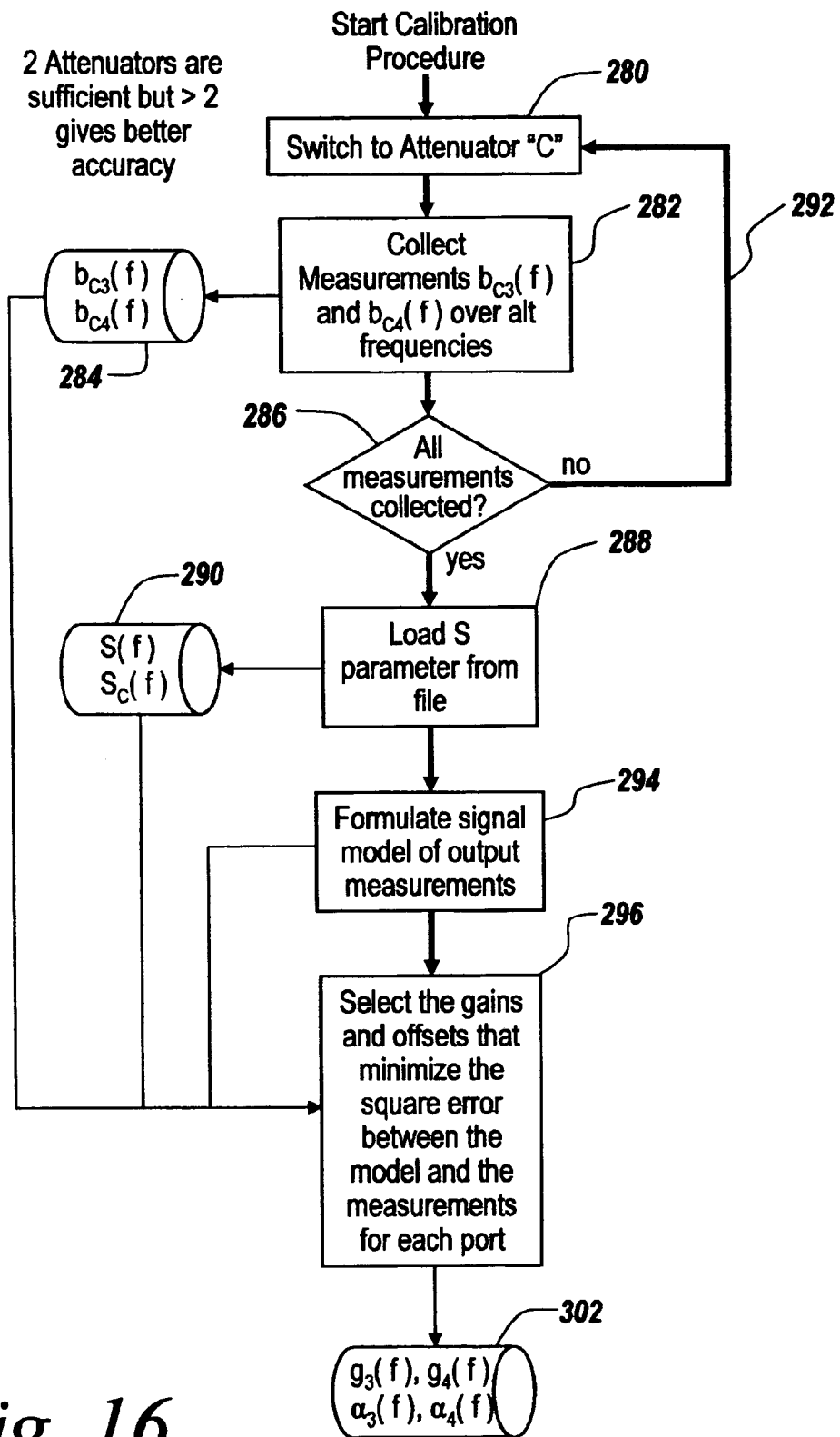
FIG. 16 is a flow chart illustrating the calibration procedure for the reflectometer of FIG. 14 utilizing calibration loads in the form of attenuator in which offset and gain are calculated by a comparison of measured data with model data and in which a least squared estimate is used to provide gain.

On the other hand, when one is using attenuators rather than switching in cal standards as is the case in FIG. 13, referring now to FIG. 16, one first switches in attenuators as illustrated at 280, with two attenuators being sufficient, but more than two giving better accuracy. One then collects measurements of the outputs over all frequencies of the multi-port junction as illustrated at 282, and stores the results as illustrated at 284. If all of the measurements are completed as illustrated at 286, one proceeds as illustrated at 288 to load attenuator and multi-port S parameters from a file such as illustrated at 290. If all of the measurements are not collected, then one switches in more attenuators as illustrated by line 292.

Having loaded in the attenuator and multi-port S parameters, as illustrated at 294, formulates the model of the output signals measured from each port as a function of the unknown gains and offsets. As illustrated in 296, gains and offsets are selected for the model that minimize the square error between this model and the measurements for each port stored at 284. The gains and offsets that minimize this square error are outputs of the calibration procedure as illustrated in 302.

Referring now to FIG. 17, one implementation of the RLC circuit described hereinbefore is accomplished by attaching to an RF connector pin 310 a bond ribbon 312, which couples the connector pin to an inductor 314 having a 5-Ohm resistor 316. The output of the inductor is coupled to a capacitor 320, which in one embodiment is a 100-PF chip capacitor that has one plate connected to the inductor and the other plate grounded.

Referring to FIG. 18, as can be seen, test port 310 is connected via switch 322 to either a cable under test 324, a first RLC circuit 326 or second RLC circuit 328.

Calibration Function

There are three factors that require the distance to fault, DTF, probe to be calibrated in order to obtain accurate fault detection and distance estimation. The DTF probe contains either dynamic log video amplifiers, DLVAs, or diode detectors or a combination of both, which have varying characteristics over temperature. The power measurements from the multi-port circuit are read from an A/D converter, so measured digital values need to be mapped to the real power values. All RF sources have power fluctuation over frequency, which needs to be accounted for. Also any power losses between the RF Source and the circuit need to be compensated for. Calibration methods for network analyzers, which use similar circuit technology, require several calibration measurements with several connections to different calibration standards. These measurements are typically used to determine the S Parameters of the network analyzer circuit. It is desirable to minimize the number of calibration measurements and to put any sort of equipment or standards required by calibration inside the final probe design.

While the present invention has been described in connection with the preferred embodiments of the various figures, it is to be understood that other similar embodiments may be used or modifications or additions may be made to the described embodiment for performing the same function of the present invention without deviating therefrom. Therefore, the present invention should not be limited to any single embodiment, but rather construed in breadth and scope in accordance with the recitation of the appended claims.

What is claimed is:

1. A method for calibrating a frequency domain reflectometer connected to a transmission line under test and having an RF frequency source, the reflectometer taking selected outputs from a multi-port junction, measuring the power thereat with power measuring circuits, and generating a complex reflection coefficient as a function of frequency from the measured power based on a gain coefficient and an offset coefficient, the complex reflection coefficient coupled to an Inverse Fourier Transform for detecting distances to a fault, comprising the steps of:

presenting the multi-port junction with a number of calibration circuits;

measuring the effect of the calibration circuits on the reflectometer;

comparing the results from the measuring step with modeled characteristics of the reflectometer, including modeled characteristics of the calibration circuits;

generating a fresh set of gain and offset coefficients to calibrate the complex reflection coefficient using the fresh set of gain and offset coefficients to provide a compensated complex reflection coefficient;

coupling the compensated complex reflection coefficient to an Inverse Fourier Transform for detecting distances to a fault; and, displaying the output of the Inverse Fourier Transform to indicate distance to a fault.

2. The method of claim 1, wherein the modeled characteristics include the scattering parameters of the multi-port junction.

3. The method of claim 2, wherein the scattering parameters are pre-measured.

4. The method of claim 1, wherein the calibration circuits include RLC circuits substituted for the transmission line under test.

5. The method of claim 1, wherein the calibration circuits include attenuators connected between the RF frequency source and the multi-port junction.

6. A method for calibrating a frequency domain reflectometer system utilizing a multi-port junction coupled to an RF frequency source and a transmission line, wherein the distance to faults of which are to be measured by generating a complex reflection coefficient from the analog-to-digital conversion of the power detected by the power detecting circuitry are detected at selected outputs of the multi-port junction, and coupling the reflection coefficient to an Inverse Fourier Transform to obtain distance to the faults comprising the steps of:

measuring the complex scattering parameters of the multi-port junction circuit;

creating a system model using the transfer function of the frequency domain reflectometer system, including the measured scattering parameters of the multi-port junction circuit and parameters of standard component models of the other components of the reflectometer system, including calibration loads and analog-to-digital converters to create a model of what the analog-to-digital conversion of the power outputs, the model including gain and offset referring respectively to the power detecting circuitry and RF signal source;

varying the gain and offset in the model until the error between the gain and offset of the model and the measured gain and offset is minimized;

using the model gain and offset resulting in minimum error in the generation of the complex reflection coefficient to provide a compensated complex reflection coefficient;

using the compensated complex reflection coefficient to measure distance to faults;

coupling the compensated complex reflection coefficient to an Inverse Fourier Transform; and, displaying distance to faults from the output of the Inverse Fourier Transform.

7. A method for calibrating a frequency domain reflectometer connected to a device and having an RF frequency source, comprising the steps of:

taking selected outputs from a multi-port junction and measuring the power thereat with power measuring circuits;

generating a complex reflection coefficient as a function of frequency from the measured power based on a gain coefficient and an offset coefficient;

presenting the multi-port junction with a number of calibration circuits;

measuring the effect of the calibration circuits on the reflectometer;

comparing the results from the measuring step with modeled characteristics of the reflectometer, including modeled characteristics of the calibration circuits;

generating a fresh set of gain and offset coefficients for use in the generation of the complex reflection coefficient, thus to calibrate the complex reflection coefficient using the fresh set of gain and offset coefficients to provide a compensated complex reflection coefficient; and, displaying the distance to a reflection based on the compensated complex reflection coefficient.

8. The method of claim 7, wherein the device is a transmission line and wherein the complex reflection coefficient is used in detecting distance to a fault in the transmission line.

9. A method for a frequency domain reflectometer system utilizing a multi-port junction coupled to an RF frequency source and a device to estimate a complex reflection coefficient from the analog-to-digital conversion of the power detected by power detecting circuitry at selected outputs of the multi-port junction comprising the steps of:

measuring the complex scattering parameters of the multi-port junction;

creating a system model using the transfer function of the frequency domain reflectometer system, including the measured scattering parameters of the multi-port junction and parameters of standard component models of the other components of the system including calibration loads and analog-to-digital converters to create a model of the analog-to-digital conversion of the power outputs, the model including gain and offset, referring respectively to the power detecting circuitry and RF signal source;

calculating the gain and offset in the model that minimizes the error between the gain and offset of the model and the measured gain and offset;

using the calculated gain and offset that minimizes the error in the estimation of the complex reflection coefficient to provide a compensated complex reflection coefficient; and, displaying the result of using the compensated complex reflection coefficient.

10. A method for determining distances to faults in a transmission line using a frequency domain reflectometer in a multi-fault environment comprising the steps of:

providing a multi-port junction having detection circuitry at selected ports and predetermined scattering parameters;

generating a compensated complex reflection coefficient from selected output ports of the multi-port junction by using a calibrated load and an RF source at input ports of the multi-port junction, including changing the un-calibrated offset and gain terms in the complex reflection coefficient for each frequency and each multi-port junction port to calibrated offset and gain terms across frequency and power, thus to characterize both variability in RF source power and variability in detection circuitry characteristics;

coupling a transmission line under test to the multi-port junction;

coupling an RF test signal to the multi-port junction;

generating for the output of the multi-port junction one complex reflection coefficient for each frequency for the transmission line under test using the calibrated offset and gain terms;

performing a modified Inverse Fourier Transform on the compensated complex reflection coefficient to obtain one complex reflection coefficient for each distance, the modified Inverse Fourier Transform using a model that takes into account phase shift per unit length of transmission line and attenuation per unit length of transmission line; and, identifying and displaying from each complex reflection coefficient for each distance the distances to candidate faults.

11. The method of claim 10 and further including calculating fault magnitudes for each identified candidate fault.

12. The method of claim 11 and further including compensating for prior faults using the fault magnitudes.

13. The method of claim 11 and further including filtering out faults having a magnitude below a predetermined magnitude for providing a filtered output, thus to eliminate ghosts.

14. The method of claim 13, wherein the identifying and displaying step includes indicating distances to candidate faults and magnitudes of the candidate faults in the filtered output.

15. The method of claim 10, wherein the step of identifying distances to candidate faults includes:

measuring the transmission line under test using the compensated complex reflection coefficient;

formulating a signal model of the measured transmission line under test;

calculating the gain and offset terms for use in the signal model that minimizes the error between the gain and offset terms of the signal model and the measured gain and offset terms; and, using the calculated gain and offset terms in the signal model to solve for distance to a fault before knowing the amplitudes of the reflections caused by a fault.

16. The method of claim 15 and further including the step of solving for the amplitude of each fault for which the distance has been calculated.

17. The method of claim 16 and further including the step of compensating for the effect of prior faults using the amplitude of each fault.

18. The method of claim 16 and further including the step of eliminating ghosts by filtering out faults having measured amplitude peaks below a predetermined threshold.

19. A method for determining distances to faults in a transmission line using a frequency domain reflectometer in a multi-fault environment comprising the steps of:

providing a multi-port junction having detection circuitry at selected ports and predetermined scattering parameters;

generating a compensated complex reflection coefficient from selected output ports of the multi-port junction by using a calibrated load and an RF source at input ports of the multi-port junction, including changing the un-calibrated offset and gain terms in the complex reflection coefficient for each frequency and each multi-port junction port to calibrated offset and gain terms across frequency and power, thus to characterize both variability in RF source power and variability in detection circuitry characteristics;

coupling a transmission line under test to the multi-port junction;

coupling an RF test signal to the multi-port junction;

generating from the output of the multi-port junction one compensated complex reflection coefficient for each frequency for the transmission line under test using the calibrated offset and gain terms;

performing an Inverse Fourier Transform on the compensated complex reflection coefficient to obtain one complex reflection coefficient for each distance; and, identifying and displaying from each complex reflection coefficient for each distance the distances to candidate faults.

20. The method of claim 19 and further including calculating fault magnitudes for each identified candidate fault.

21. The method of claim 20 and further including compensating for prior faults using the fault magnitudes.

22. The method of claim 20 and further including filtering out faults having a magnitude below a predetermined magnitude for providing a filtered output, thus to eliminate ghosts.

23. The method of claim 22, wherein the identifying and displaying step includes indicating distances to candidate faults and magnitudes of the candidate faults in the filtered output.

* * * * *